United States Patent
Repp

(10) Patent No.: US 12,278,019 B2
(45) Date of Patent: Apr. 15, 2025

(54) METHOD AND CIRCUITRY TO APPLY AN INDIVIDUAL DC OFFSET TO ELECTRODES ON A LARGE-SCALE ION TRAP QUANTUM COMPUTER

(71) Applicant: Infineon Technologies Austria AG, Villach (AT)

(72) Inventor: Jens Repp, Markt Schwaben (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 83 days.

(21) Appl. No.: 18/300,203

(22) Filed: Apr. 13, 2023

(65) Prior Publication Data
US 2024/0355495 A1    Oct. 24, 2024

Related U.S. Application Data

(63) Continuation of application No. 17/856,093, filed on Jul. 1, 2022, now abandoned.

(51) Int. Cl.
*G21K 1/00* (2006.01)
*H03M 1/66* (2006.01)

(52) U.S. Cl.
CPC .............. *G21K 1/00* (2013.01); *H03M 1/662* (2013.01)

(58) Field of Classification Search
CPC .......... G21K 1/00; H03M 1/66; H03M 1/662; G06N 10/40; H01J 49/42; H01J 49/4245; H01J 49/4255
See application file for complete search history.

(56) References Cited

U.S. PATENT DOCUMENTS

| 10,635,990 B1* | 4/2020 | Park | H01L 29/0692 |
| 2024/0006092 A1* | 1/2024 | Repp | G21K 1/00 |
| 2024/0214001 A1* | 6/2024 | Romaszko | G06N 10/40 |

OTHER PUBLICATIONS

Stuart et al, "Chip-Integrated Voltage Sources for Control of Trapped Ions", Physical Review Applied 11, 024010 (2019)) (Year: 2019).*
Baig, M.T. et al., "A Scalable, Fast and Multichannel Arbitrary Waveform Generator," Review of Scientific Instruments, Rev. Sci. Instrum. 84, 124701, 2013, https://doi.org/10.1063/1.4832042, XP055897991, Submitted Sep. 6, 2013, Accepted: Nov. 5, 2013, Published Online: Dec. 9, 2013, 12 pages.
Erlangung, Z., "A Shutting-Based Trapped-Ion Quantum Processing Node," JG/U, Johannes Gutenberg Universitat Mainz, Dissertation, Mainz, Germany, Oct. 31, 2019, 257 pages.

(Continued)

*Primary Examiner* — David E Smith
(74) *Attorney, Agent, or Firm* — SLATER MATSIL, LLP

(57) ABSTRACT

A device includes a plurality of digital-to-analog converters (DACs), a multiplexer, a plurality of electrodes including a first electrode, and a plurality of direct current (DC) offset circuits including a first DC offset circuit. At least one of the plurality of electrodes is located along a lane for movement of an ion. The multiplexer has multiple inputs coupled to the plurality of DACs and multiple outputs including a first output. The first output is configured to provide a first voltage. The first DC offset circuit is coupled between the first output and the first electrode. The first DC offset circuit is configured to add a first DC offset voltage to either the first voltage or the first voltage amplified by a first gain. The first DC offset voltage is configurable.

20 Claims, 14 Drawing Sheets

(56) References Cited

OTHER PUBLICATIONS

Doret, S.C. et al., "Controlling Trapping Potentials and Stray Electric Fields in a Microfabricated Ion Trap Through Design and Compensation," New Journal of Physics, 14, Jul. 6, 2012, 17 pages.
Stuart, J. et al., "Chip-Integrated Voltage Sources for Control of Trapped Ions," Physical Review Applied 11, 02410, Feb. 5, 2019, 7 pages.

* cited by examiner

METHOD AND CIRCUITRY TO APPLY AN INDIVIDUAL DC OFFSET TO ELECTRODES ON A LARGE-SCALE ION TRAP QUANTUM COMPUTER

CROSS-REFERENCE TO RELATED APPLICATIONS

This application is a Continuation in Part and claims the benefit of U.S. application Ser. No. 17/856,093, filed on Jul. 1, 2022, which application is hereby incorporated herein by reference.

TECHNICAL FIELD

The present invention relates generally to a system and method for controlling movement of an ion in trapped ion quantum computing (TIQC), and, in particular embodiments, to a system and method for providing voltages to electrodes in a TIQC system.

BACKGROUND

Generally, trapped ion quantum computing uses ions as qubits for computation, with the excitation state of an electron indicating a logical value or logic state. Ions such as barium (Ba), magnesium (Mg), calcium (Ca), beryllium (Be), or the like, may be positively charged, and a single electron in the outer shall of the ion used as the logic element. Two or more ions may be entangled, as changing the state of one qubit causes the entangled qubits to change their state immediately, providing substantial speed and power savings over conventional computing. Quantum computing may require a well-controlled environment and precise handling of the ions. The ions also typically require cryogenic conditions to achieve the maximum benefit of quantum computing. Thus, while photonic quantum computing works at room temperature, cryogenic trapped ion quantum computing is performed in a sealed cryogenic chamber kept between around 4 and 10 Kelvin.

Ions in a TIQC system may be trapped or controlled using a radio frequency (RF) field operating at around 200 volts, and 20 megahertz (MHz). Ions may require rapid handling because once entangled, they have a limited duration for which they will stay entangled. In a TIQC system, electrostatic potentials are used to move ions between storage and processing locations in a process called ion shuttling. In order to control these potentials, hundreds, or even thousands, of electrodes may be simultaneously controlled to provide an intended electric field (E-field). Therefore, accurate control of the potentials created by the electrodes in the TIQC system is desired.

SUMMARY

An embodiment device includes a plurality of digital-to-analog converters (DACs), a multiplexer having multiple inputs and multiple outputs, the multiple inputs coupled to the plurality of DACs, the multiple outputs including a first output configured to provide a first voltage, a plurality of electrodes including a first electrode, at least one of the plurality of electrodes located along a lane for movement of an ion, and a plurality of direct current (DC) offset circuits including a first DC offset circuit, the first DC offset circuit coupled between the first output and the first electrode, the first DC offset circuit configured to add a first DC offset voltage to either the first voltage or the first voltage amplified by a first gain, the first DC offset voltage being configurable.

An embodiment ion control system includes an electrode control circuit, a plurality of electrodes, at least one of the plurality of electrodes located along a lane for movement of an ion, a plurality of digital-to-analog converters (DACs) configured to provide voltages to the plurality of electrodes, the voltages controlling the movement of the ion, a multiplexer including multiple inputs and multiple outputs, the multiple inputs coupled to the plurality of DACs, the multiplexer configured to selectively connect one or more of the plurality of DACs to one or more of the plurality of electrodes in accordance with a control signal provided by the electrode control circuit, and a plurality of direct current (DC) offset circuits, each of the plurality of DC offset circuit coupled between a corresponding output of the multiplexer and a corresponding electrode and configured to add a DC offset voltage to either an output voltage of the corresponding output of the multiplexer or the output voltage of the corresponding output of the multiplexer amplified by a gain, the DC offset voltage being configurable.

An embodiment method for providing direct current (DC) offset voltages in a trapped ion quantum computing (TIQC) system includes having a multiplexer coupled between a plurality of digital-to-analog converters (DACs) and a plurality of direct current (DC) offset circuits, each of the plurality of DC offset circuit further coupled to a respective electrode belonging to a plurality of electrodes, at least one of the plurality of electrodes located along a lane for movement of an ion, converting, by the plurality of DACs, multiple digital voltage values to multiple analog voltages, connecting, by the multiplexer, one or more of the plurality of DACs to one or more of the plurality of DC offset circuits in accordance with an electrode control circuit, generating, by a first DC offset circuit belonging to the plurality of DC offset circuits, a first compensated voltage by adding a first DC offset voltage to either a first voltage received from a first output of the multiplexer or the first voltage amplified by a first gain, the first DC offset voltage being configurable, and providing, by the first DC offset circuit, the first compensated voltage to a first electrode coupled to the first DC offset circuit, the first electrode belonging to the plurality of electrodes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
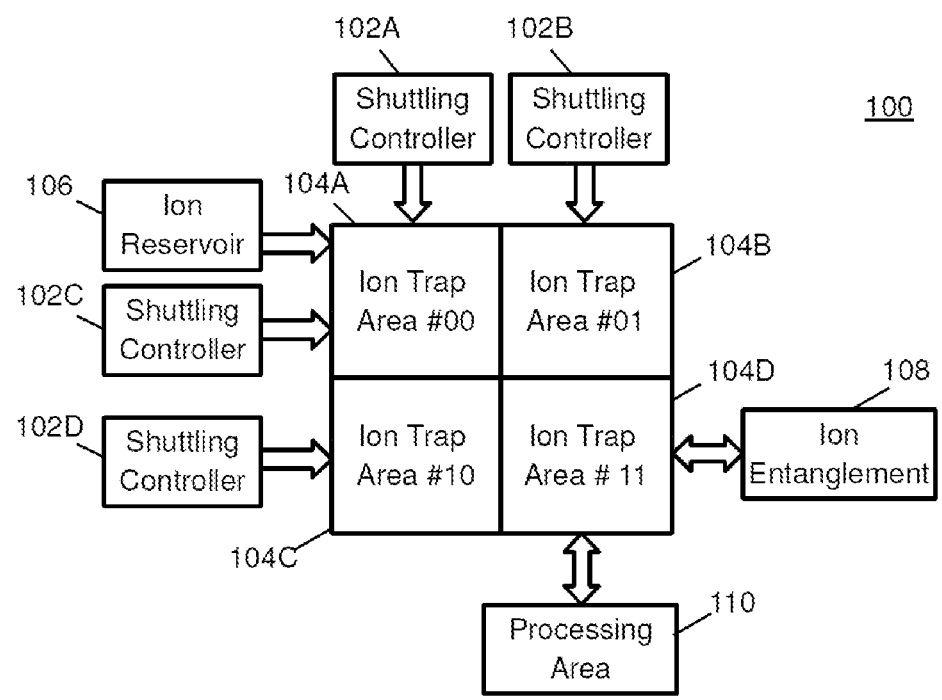
FIG. 1 is a logical diagram illustrating a trapped ion quantum computing (TIQC) system with an ion shuttling system according to some embodiments.

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

In a trapped ion quantum computing (TIQC) system, electrostatic potentials are used to move ions between storage and processing locations in a process called ion shuttling. In order to control these potentials, hundreds, or even thousands, of electrodes must be simultaneously controlled in order to provide the desired electric field (E-field). Individualized control of the electrodes requires use of digital-to-analog converters (DACs). A wire may need to be passed through an envelope of a cryogenic containment system to connect each DAC to a respective electrode. Thus, a one-to-one DAC-to-electrode arrangement may result in high cost and power requirements associated with the DAC-to-electrode connections. Furthermore, stray electric fields may arise from process spread and stray charges on direct current (DC) electrodes in a TIQC system. The stray electric fields may cause excess micromotion and increased heating rates of a trapped ion. A large-scale ion trap processor may require a larger number of DC electrodes, and individual DC offset voltage may be added to each DC electrode to compensate the stray electric fields. Therefore, advanced techniques to efficiently connect DACs and electrodes and apply DC offset voltages are desired.

DACs in an ion shuttling system may be multiplexed, such as those described in U.S. patent application Ser. No. 17/715,731, entitled "Multi Dimensional Electrode Controller for Quantum Computing" and filed on Apr. 7, 2022, which is hereby incorporated herein by reference as if reproduced in its entirety. The principles presented in U.S. patent application Ser. No. 17/715,731 are directed to providing a system for ion shuttling using a limited number of DACs that are multiplexed to a large number of electrodes in a multidimensional array. The multidimensional ion shuttling system provides for shuttling of multiple ions in multiple different directions simultaneously using the same DACs. A limited number of DACs being used to control the electrodes also limits the number of electrical connections that need to pass through the cryogenic containment system envelope.

Aspects of the present disclosure provide techniques that add individual DC offset voltages to outputs of multiplexed DACs to compensate the stray electric fields in a TIQC system. Specifically, the generation of DC voltages and the adding of the DC offset voltages are split into two separate processes. In the first process, multiple DACs are coupled to inputs of a multiplexer to provide DC voltages required by the electrodes. In the second process, each output of the multiplexer is coupled to a DC offset generation circuit, and an output of the DC offset generation circuit is coupled to a corresponding electrode. In some embodiments, the DC offset generation circuit is implemented by an operational amplifier (OP-AMP) integrated with configurable current sources. According to the present disclosure, an offset compensation, which is traditionally used to compensate an internal offset in an OP-AMP, may now be used to add an offset to the OP-AMP's input on purpose. Such a DC offset generation circuit is configured to amplify an output of the multiplexer by a gain and add a configurable DC offset voltage to the amplified output. The gain may or may not be configurable. The amplification may relax the digital resolution requirement of the DACs because low voltages generated by the DACs can be amplified so that the required high voltages may still be applied to the electrodes. Conventionally, high resolution DACs are required even for compensating relatively small stray fields, which increases the cost, the power and chip area consumption of the TIQC system. According to the present disclosure, high resolution requirements for relatively fast operating DACs may no longer be necessary because the problem may be solved by the offset compensation techniques provided in the present disclosure. Aspects of the present disclosure allow the TIQC system to use a smaller number of low-resolution DACs, and thus reduce the cost and power requirement of TIQC and provide an improved flexibility.

FIG. 1 is a logical diagram illustrating a trapped ion quantum computing (TIQC) system 100 with an ion shuttling system according to some embodiments. The TIQC system 100 has one or more ion trap areas 104A-104D that including ion shuttling systems, and which are configure to shuttle ions between target areas such as an ion reservoir 106, ion entanglement region 108, and other areas such as ion disposal areas (not shown), processing areas 110, and between the ion trap areas 104A-104D. The TIQC system 100 may also have one or more shuttling controllers 102A-102D electrically connected to the ion shuttling systems of the ion trap areas 104A-104D to control movement of the ions.

While the TIQC system 100 is illustrated with four ion trap areas 104A-104D and four shuttling controllers 102A-102D, with the ion trap areas 104A-104D in a symmetrical arrangement, the TIQC system 100 is not limited to such an arrangement. The shuttling controllers 102A-102D provide addressable voltage control of electrodes, and are, therefore, configured to control any number of cascaded ion trap areas 104A-104D, in any arrangement. Additionally, the shuttling controller 102A-102D may be provide as a unitary controller, with a single controller controlling any number or size of the ion trap areas 104A-104D. The ion trap areas 104A-104D may also be cascaded so that additional ion trap areas 104A-104D and shuttling controllers 102A-102D may be connected to existing ion trap areas 104A-104D and shuttling controller 102A-102D to expand the shuttling area, number of ions controlled, and capabilities of the ion shuttling system.

Additionally, the shuttling system may have a radio frequency (RF) system (not shown) that provides an RF containment field separately from the DC bias of the shuttling electrodes. The RF field may be provided by electrodes that are separate from electrodes used to provide a shuttling or peeking voltage. In some embodiments, the RF field may be operated at around 200 volts, and 20 megahertz (MHz), and the DC fields may be provided locally and separately to shuttle ions being contained by the RF field.

Figure 2:
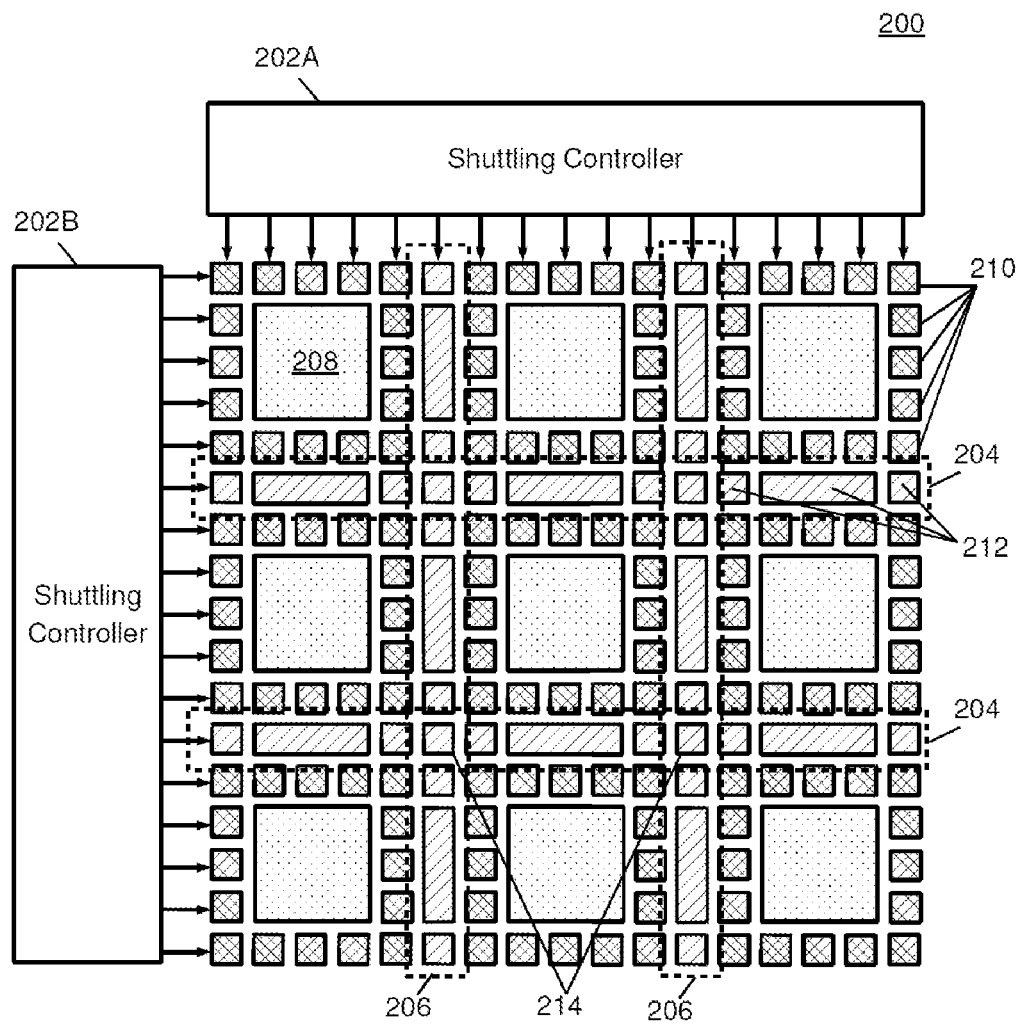
FIG. 2 is a diagram illustrating an ion shuttling system according to some embodiments.

FIG. 2 is a diagram illustrating an ion shuttling system 200 according to some embodiments. The ion shuttling system 200 includes a shuttling controller 202 comprising a first shuttling controller portion 1202A and second shuttling controller portion 202B. The first shuttling controller portion 202A and second shuttling controller 202b may be connected to a set of voltage electrodes 210 arranged in a two dimensional pattern, or in another arrangement with one dimension, or in three dimensions for layered patterns. The shuttling controller 202 provides a direct current (DC) biasing voltage to the voltage electrodes 210 to move and steer ions along shuttling elements 212 of shuttling lanes 204, 206. The shuttling controller 202 provides a voltage to each electrode 210, which is set by a latch associated with the electrode 210. Using a latch, rather than a DAC, at each electrode 210 permits for a lower component count, as the DAC requires a far greater number of components than a latch. The shuttling controller 202 may address an individual electrode element, which includes the latch and electrode 210 itself, and may provide a voltage signal or other signal to set the voltage for a particular electrode 210, which is set by the electrode's 210 associated latch. Thus, the voltage of each electrode 210 may be set individually, and is maintained until reset or changed.

In some embodiments, the shuttling controller 202 addresses the individual electrodes 210 by providing a shuttle enable (SHEN) signal that is stored in the latch, and which is used to apply a voltage, by controlling a transistor, to the electrode 210. An electrode select (ESEL) signal is used to select an electrode in the addressed row or column, and the ESEL signal activates the latch to latch the SHEN signal. Thus, the electrode 210 in a particular column and row may have a shuttling voltage set when the both the ESEL signal and SHEN signal are activated, and the electrode latch or storage element sets the voltage at the electrode 210.

Setting a DC voltage on a pair of electrodes 210 separated by a lane element 212 creates DC bias in the E-field, with the DC bias allowing control of the position of an ion. Changing the voltage on the electrodes 210 permits control of the movement of the ion, and with electrodes 210 being located on each side of a lane element 212, ions may be moved along the lane elements 212 in shuttling lanes 204, 206. The shuttling lanes 206, 204 may be arranged so that shuttling lanes 204, 206 cross to form intersections 214 to allow for switching an ion onto different shuttling lanes 204, 206 for two dimensional movement. The electrodes 210 and lane elements 212 may be arranged so that free space is created between the electrodes 210, and shield elements 208 may be provided to shield the electrodes 210 and ions located in shuttling lanes 204, 206, from voltages provided for other ions in other locations along the shuttling lanes 204, 206. Such an arrangement may reduce cross-talk between ions in the shuttling system and simplify production of the shuttling system. Additionally, while the shuttling lanes 204, 206 and electrodes 210 are arranged in FIG. 2 in a symmetrical pattern, the electrodes 210 and shuttling lanes 204, 206 are not limited to such an arrangement, as any arrangement in two dimensions may be provided, including an arrangement where shuttling lanes 204, 206 intersect or cross at non-right angles. Additionally, shuttling lanes 204, 206 are not limiting to crossing each other, as the shuttling lanes 204, 206, may form a three way, or 'T' intersection, or may form a turn or angle, such as an 'L' shaped intersection.

In some embodiments, the ion shuttling system 200 may be formed using semiconductor packaging or fabrication techniques, for example, by depositing conductive material on a substrate and etching electrodes, lane elements, shields, connectors, and the like, into the surface. Additionally, connection layers, such as layers of conductive wiring, may be formed as a stack or on the backside of the system to provide connections to control elements such as multiplexers, DACs, and the like. One or more other devices, such as transistors, or logic gates, or other circuits may also be formed or located on the surface of the system substrate, on the backside of the substrate, on the wiring layers, or the like, to permit integration of the system elements into a package or system-on-chip (SoC). Additionally, any analog or digital circuit may be integrated with the passive part of the ion trap consisting of electrodes and wiring, and integration may be done on the same substrate or using stacked dies.

Figure 3A:
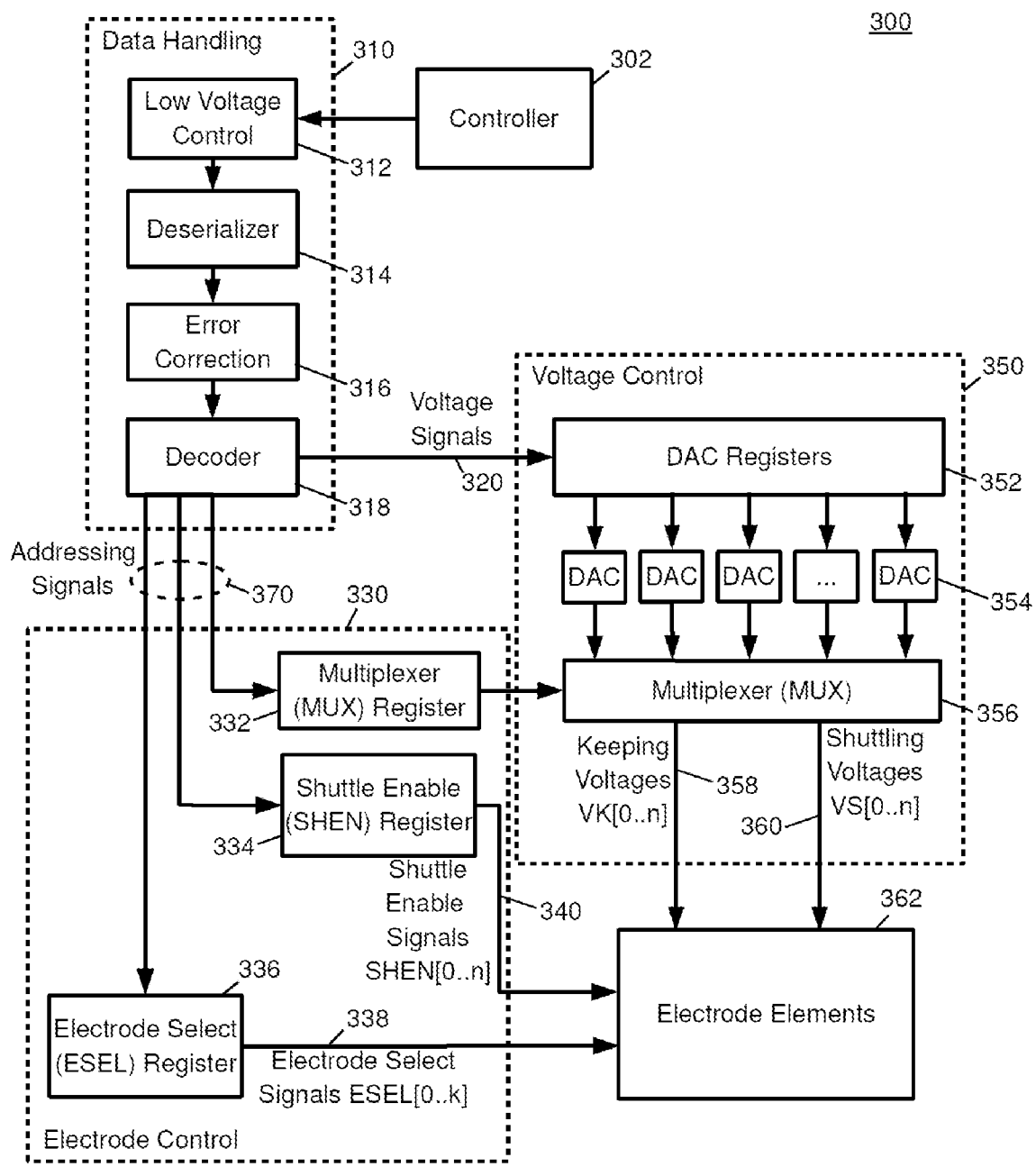
FIGS. 3A-3B illustrate a diagram of an ion shuttling control system according to some embodiments and an analog multiplexer for an ion shuttling control system according to some embodiments.

FIG. 3A is a diagram illustrating an ion shuttling control system 300 according to some embodiments. The shuttling control system 300 may have a data handling element 310 that receives data from a controller 302, and provides voltage signals 320 or data values to a voltage control 350 and addressing signals or values an electrode control 330. The voltage control 350 generates voltages from the data values, with the voltages applied to electrode elements 362 for creating the E-field at the electrodes. The electrode control 330 provides signals to the electrode elements 362 to activate particular electrode elements to load or set the voltage provided by the voltage control 350.

In some embodiments, the data handling element 310 has a digital control interface 312. The digital control interface 312 may, for example, be a low voltage serial receiver that receives data using a 2-wire system, or using another communication system or protocol. The digital control interface 312 may receive a serial communication from the controller 302 indicating ion control information, for example, a location for an ion within an ion trap, one or more voltages or voltage profiles for one or more electrodes, data indicating a path for ion movement or the like. Thus, the controller 302 may determine where a shuttling electrode group is located, and may identify or provide information for identification of the shuttling electrode group or shuttling electrodes or electrode elements. Additionally, the controller 302 may provide information for shuttling voltage or the like, so that the system may determine shuttling voltages for controlling ion movement.

The digital control interface 312 may have a serial interface to reduce the number of electrical connections that would be needed, for example, for a parallel interface or other interface type. However, where the number of connections is not a significant factor, the digital control interface 312 could be any another type of communications interface, such as a parallel interface, wireless interface, USB interface, or other communications interface or connection.

In some embodiments, the data handling element 310 also has a deserializer 314, which converts data from a serial format to another format such as a digital format. The deserializer 314 works in conjunction with a serial digital control communications interface, and may be a different type of data converter, or even omitted, if the low voltage control in the digital control interface 312 uses another format. In some embodiments, the data handling element 310 also has an error correction element 316 that verifies, corrects, or requests resending of data.

The data handling element 310 may also have a decoder that decodes data element from the ion control information. The ion control information may include, for example, one or more voltage values and associated addresses, and the decoder 318 may determine the column and row of an electrode to be addressed and set with the associated voltage, and may provide addressing signals 370 to the electrode control 330, and provide a voltage to the voltage control 350. In some embodiments, the voltage values may include information, data, or values for a neutral voltage profile for holding an ion on a particular location, or include information, data or values for shuttling voltages for a voltage profile such as a shuttling voltage profile for moving an ion between lane elements. In some embodiments, a neutral voltage profile may be different from a shuttling voltage profile, with a symmetrical or simpler voltage profile since an E-field gradient needed to maintain an ion in a fixed location requires less shaping than an E-field gradient that would cause an ion to move in a desired direction. Additionally in some embodiments, the voltages may be keeping voltages for maintaining a base, default, or standard bias voltage against which the neutral voltage profiles or shuttling voltage profiles are changed to provide a localized E-field gradient to trap or control the ions.

In some embodiments, the ion control information may include an explicit address for a particular associated voltage level, and the ion control information may indicate explicit addresses and voltages for each electrode being set for a particular voltage profile. The voltage level may be indicated as an explicit voltage level as an integer or real number, such as +7.2 volts. In other embodiments, the voltage level may be indicated by an index that determines the voltage level from a predetermined formula, table, or the like. For example, the voltage may be indicated by an index of 4, which may be used to reference a table indicating a desired voltage value of +7.0 v, or may be used in a calculation to determine the desired voltage, for example, by multiplying the index by a voltage factor to determine the desired voltage level.

In other embodiments, the ion control information may define a voltage profile and a base location. A voltage profile may indicate a type of movement, type of voltage profile, or the like, and the voltages for multiple electrodes that would be determined to provide the voltage profile may be predefined. For example, a voltage profile may have predetermined voltages for electrodes, with a first electrode pair at +6 v, a second electrode pair at +2 v, a third electrode pair at +4 v, and a fourth electrode pair at +7 v, the ion control information may describe an address for one or more of the electrode pairs, and the voltage for each electrode pair of the voltage profile may be determined based on the electrode pair's relative location to address based on the predetermined voltages for the voltage profile. In another embodiment, the ion control information may also describe a movement direction for the voltage profile so that an asymmetric voltage profile may be oriented correctly. In some embodiments, the ion control information may also include a path, speed or movement profile for the ion so that a voltages may be set by the decoder based on a time function, with, for example, new electrode voltages being set every second to move the voltage profile or change the voltages, causing the ion to move along the identified path or in the identified direction.

In some embodiments, the voltage control 350 comprises DAC registers 352, DACs 354 and a multiplexer (MUX) 356. The DAC registers 352 hold voltage values for the DACs, and the DACs convert digital voltage values to analog voltage values or signals. The DAC registers 352 may be used to hold the voltages long enough for the DACs 354 to propagate an analog voltage through themselves and through the multiplexer 356 to be provided to by the electrode elements 362. The analog voltage values may be sent to a multiplexer 356 that receives addressing information to route particular voltages to particular columns of electrode elements 362. Each DAC 354 may be set with a keeping voltage or shuttling voltage, so that, for example, an entire row, column, segment of columns or rows may be set. Setting a single row, column, row segment or column segment of the electrodes permits a limited number of DACs 354 to be used, as the DACs 354 may be reused to set another group of electrodes.

In some embodiments, the multiplexer 356 may be an analog multiplexer that passes on analog voltages rather than simply providing a digital output levels. Additionally, the analog multiplexer may be configured to allow selection of an analog shuttling voltage and selection of a keeping voltage for a plurality of electrodes.

The electrode control 330 may have a multiplexer register 332 that provides a control signal that selects one or more DACs 354 used to provide one or more voltages to selected electrode elements 362. The multiplexer register 332 may provide multiple control signals allowing selection of the voltage for different output lines. For example, in some embodiments, the multiplexer 356 may selectively provide a shuttling voltage VS 360 selected from a plurality of shuttling voltages VS 360 on a first output for a particular electrode column, and a keeping voltage VK 358 or neutral voltage selected from a plurality of keeping and neutral voltages on a second output for the particular electrode column. Providing both the shuttling voltage VS 360 and the keeping voltage VK 358 to a particular electrode permits the shuttling voltage VS 360 and keeping voltage VK 358 to be set to separate values, with an electrode enable signal ESEL provided to the electrode element 362 to be used to select between the shuttling voltage VS 360 and keeping voltage VK 358 for application to the electrode, and also allows each electrode in a group to be selectively set to the shuttling voltage VS 360 or keeping voltage VK 358 using the electrode enable signal. Additionally, the multiplexer may be configured to receive a plurality of different shuttling voltages VS 360 from a first plurality of the DACs 354, and provide at least one of the different shuttling voltages VS 360 to one or more outputs associated with the different electrode column. Thus, a DAC 354 may provide a shuttling voltage VS 360 that is used to set electrode elements 362 in different columns, reducing the number of DACs 354 required to set a great number of electrode elements 362. This may be achieved by setting different DACs to the different voltages required for a shuttling voltage profile, and using the DAC 354 to provide the required voltages for the different electrodes, rather than having a single DAC associated with electrode in a group, and potentially setting multiple DACs with the same voltage. Similarly, another DAC 354 may provide a keeping voltage VK 358 used to set a voltage in multiple electrodes, reducing the number of needed DACs 354.

In some embodiments, the electrode control 330 may also include a shuttle enable (SHEN) register 334 and an electrode select (ESEL) register 336. The SHEN register 334 receives addressing signals 370 from the decoder 318 indicating which electrodes are shuttling electrodes, namely electrodes that are assigned to have a voltage that is part of a shuttling voltage profile. The SHEN register 334 holds a value for shuttle enable signals SHEN [0 . . . n] 340 and provides one or more shuttle enable signals SHEN [0 . . . n] 340 to the electrode elements 362 to cause electrodes designated as the shuttling electrodes to use the shuttling voltages rather than the keeping voltages. Thus, the shuttle enable signals SHEN[0 . . . n] enable electrodes to act as shuttle electrodes.

The ESEL register 336 receives addressing signals 370 from the decoder 318 indicating which electrodes are activated. The ESEL register 336 holds values for electrode select signals ESEL [0 . . . k] and provides the electrode select signals ESEL [0 . . . k] to the electrode elements to activate or select designated electrodes to set the selected shuttling voltages 360 or keeping voltages 358s. Thus, the electrode select signals ESEL[0 . . . k] enable electrode elements 362 to apply a voltage to electrodes to create the E-field to control movement of an ion.

In some embodiments, a set of electrodes or a portion of an ion shuttling system may have electrodes in a single dimension, along a single movement path, or the like. In such embodiments, the electrode select signals ESEL[0 . . . k], shift enable signals SHEN[0 . . . n], shuttling voltages VS, and keeping voltages VK may be single sets of signals for single dimension electrode arrays. In other embodiments, a set off electrodes or a portion of an ion shuttling system may have multidimensional electrode arrangements, with one or more paths crossing each other or otherwise forming intersections. For the multidimensional electrode arrangements, one or more of the electrode select signals ESEL[0 . . . k], shift enable signals SHEN[0 . . . n], shuttling voltages VS, or keeping voltages VK may have multiple dimensions. For example, the electrode select signals ESEL[0 . . . k] may have electrode select signals for an x- and y-direction so that a group of electrodes may be selected from a grid. Thus, a range of electrodes in an x-direction, and a range of electrodes in a y-direction may be elected, with electrodes falling into both the selected x- and y-direction range are activated. The shift enable signals SHEN[0 . . . n], shuttling voltages VS, or keeping voltages VK may have similar x- and y-direction signals, or may be provided for an x- and y-direction.

Figure 3B:
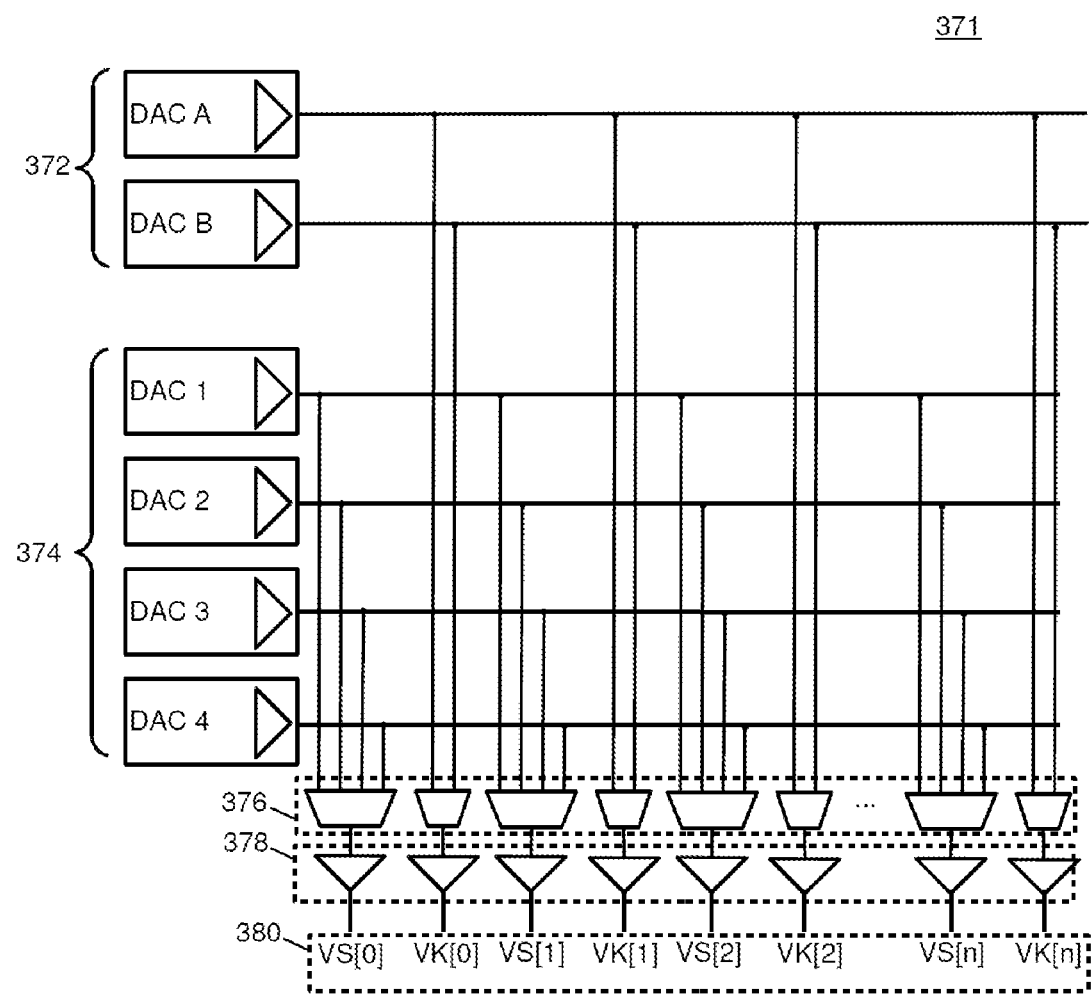

FIG. 3B is an analog multiplexer 371 for an ion shuttling control system according to some embodiments. The analog multiplexer 371 may have a plurality of line multiplexers 376 that multiplex signals from a plurality of DACs. The DACs may include a plurality of keeping voltage DACs 372 and a plurality of shuttling voltage DACs 374. The line multiplexers 376 provide output signals 380 to different lines, or set of electrodes, and may include a plurality of shuttling voltage multiplexers and a plurality of keeping voltage multiplexers. Additionally, in some embodiments, each line multiplexer 376 provide an output signal 380 through a buffer 378, or through one or more other elements for processing, handling, manipulating or modifying the output signal 380.

Each shuttling voltage multiplexer is connected to a plurality of the shuttling voltage DACs 374, and may be switched to provide a shuttling voltage VS[0 . . . n] to a plurality of different electrodes by connecting a selected one of the shuttling voltage DACs 374 to one or more electrodes. Similarly, each keeping voltage multiplexer is connected to a plurality of the keeping voltage DACs 372, and may be switched to provide a keeping voltage VK[0 . . . n] to a plurality of different electrodes by connecting a selected on the keeping voltage DACs 372 to one or more electrodes. The electrodes may then be activated and selected to turn on the electrode and cause the electrode to use the provided shuttling voltage VS [0 . . . n] or the provided keeping voltage VK[0 . . . n].

Thus, a device for trapping or shuttling an ion may include a plurality of DACs, a multiplexer having multiple inputs and multiple outputs, the multiple inputs coupled to the plurality of DACs, the multiple outputs including a first output configured to provide a first voltage, a plurality of electrodes including a first electrode, at least one of the plurality of electrodes located along a lane for movement of the ion, and a plurality of DC offset circuits including a first DC offset circuit. The first DC offset circuit is coupled between the first output and the first electrode and is configured to add a first DC offset voltage to either the first voltage or the first voltage amplified by a first gain. The first DC offset voltage may be configurable. The device may be configured to either hold the ion in a predetermined location by providing a neutral voltage profile to the plurality of electrodes or shuttling the ion between target areas such as ion trap areas, ion reservoirs, and processing areas by providing a shuttling voltage profile to the plurality of electrodes. The device may further include an RF system. The RF system is configured to provide an RF containment field to contain the ion.

Additionally, an ion control system for trapping or shuttling an ion may include an electrode control circuit, a plurality of electrodes, at least one of the plurality of electrodes located along a lane for movement of the ion, a plurality of DACs configured to provide voltages to the plurality of electrodes, the voltages controlling the movement of the ion, a multiplexer including multiple inputs and multiple outputs, the multiple inputs coupled to the plurality of DACs, the multiplexer configured to selectively connect one or more of the plurality of DACs to one or more of the plurality of electrodes in accordance with a control signal provided by the electrode control circuit, and a plurality of DC offset circuits. Each of the plurality of DC offset circuit is coupled between a corresponding output of the multiplexer and a corresponding electrode and is configured to add a DC offset voltage to either an output voltage of the corresponding output of the multiplexer or the output voltage of the corresponding output of the multiplexer amplified by a gain. The DC offset voltage may be configurable. The ion control system may be configured to either hold the ion in a predetermined location by providing a neutral voltage profile to the plurality of electrodes or shuttling the ion between target areas such as ion trap areas, ion reservoirs, and processing areas by providing a shuttling voltage profile to the plurality of electrodes. The ion control system may further include an RF system. The RF system is configured to provide an RF containment field to contain the ion.

Figure 4:
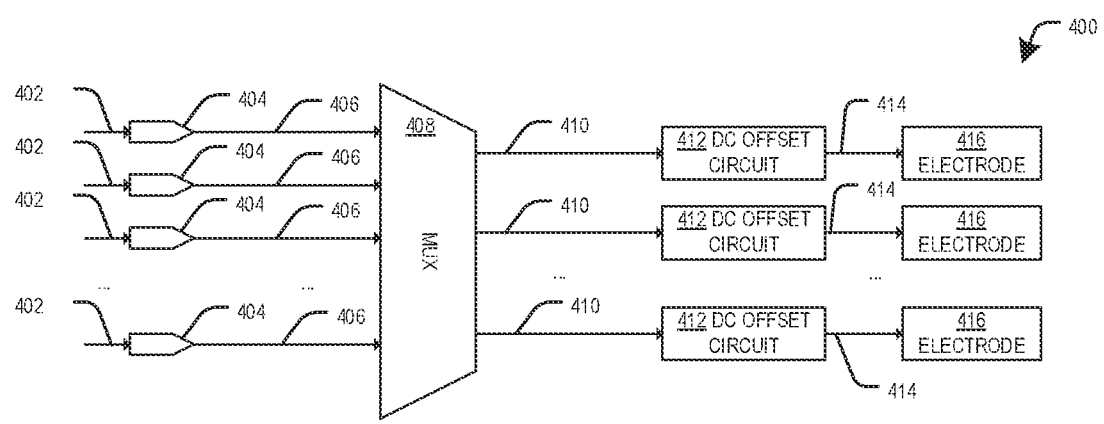
FIG. 4 illustrates a stray electric field compensation circuit in a TIQC system according to some embodiments.

FIG. 4 illustrates a stray electric field compensation circuit 400 in a TIQC system according to some embodiments. The stray electric field compensation circuit 400 may include a plurality of DACs 404, a multiplexer 408, a plurality of DC offset circuits 412, and a plurality of electrodes 416. The DACs 404 are coupled to inputs of the multiplexer 408. Each DAC 404 may convert a digital signal 402 into an analog signal 406 and output the analog signal 406 to the multiplexer 408. The multiplexer 408 is configured to connect one or more of its inputs to one or more of its outputs. Each of the plurality of electrodes 416 is coupled to a respective output of the multiplexer 408 through a DC offset circuit 412. Thus, a signal 410 provided by an output of the multiplexer 408 to a DC offset circuit 412 may come from a DAC 404 connected to the DC offset circuit 412 by the multiplexer 408. The DC offset circuit 412 may be configured to provide a signal 414 to the electrode 416 that is coupled to the DC offset circuit 412. In various embodiments, one or more electrodes (not shown in FIG. 4), which may not require an offset compensation, may be connected directly to outputs of the multiplexer 408 without going through DC offset circuits.

The digital signals 402 may be the digital keeping voltage values or the digital shuttling voltage values that are stored in DAC registers as illustrated in FIG. 3A. The analog signals 406 may be the analog keeping voltages or the analog shuttling voltages converted by the DACs 404. The signals 410 and the signals 414 may also be analog voltages.

The routing between the inputs and outputs of the multiplexer 408 may be determined by an electrode control circuit (such as the electrode control 330 in FIG. 3A) through a control signal. Both the electrode control circuit and the control signal are not shown in FIG. 4.

If each output of the multiplexer 408 is directly connected to a corresponding electrode 416 (without going through DC offset circuits 412), the digital voltage values 402 (which may be converted to the analog signals 406, routed by the multiplexer 408, and become the analog voltages 410) may generate DC electric fields through the electrodes 416 to control movement of a trapped ion. However, the generated DC electric fields may be interfered by stray electric fields, and thus may not be exactly the desired DC electric fields that the digital voltage values 402 intend to generate. The stray electric fields may arise from process spread and stray charges on the electrodes in the TIQC system. Excess micromotion and increased heating rates of the trapped ion may occur due to existence of the stray electric fields.

Therefore, in order to compensate the stray electric fields and precisely control the movement of the trapped ion, an individual DC offset circuit 412 is coupled between each electrode 416 and a corresponding output of the multiplexer 408. In one embodiment, the DC offset circuit 412 is configured to add an individual DC offset voltage to a corresponding analog voltage 410. In other words, the analog voltage 414 is equal to the corresponding analog voltage 410 plus the individual DC offset voltage. In this case, if high voltages are required at the electrodes 416, the DACs 404 may need to provide high voltages and support high digital resolutions.

In another embodiment, the DC offset circuit 412 is configured to amplify the corresponding analog voltage 410 with an individual gain and add an individual DC offset voltage to the amplified analog voltage. In other words, the analog voltage 414 is equal to the corresponding analog voltage 410 multiplied by the individual gain plus the individual DC offset voltage. In this case, with appropriate amplification, even if high voltages are required at the electrodes 416 due to stray field compensation, the DACs 404 may only need to provide low voltages and support low digital resolutions, which lead to reduced power and chip area consumption. Thus, the DC offset circuit 412 with an amplification function may relax the digital resolution requirement of the DACs 404.

The gains and DC offset voltages associated with the DC offset circuits 412 are intended to produce DC electric fields that compensate the stray electric fields. The desired gains and DC offset voltages may be determined in various ways. These gains and DC offset voltages may be programmable and configurable values or parameters. Once programmed or configured, these values may hold for different time periods. In some embodiments, these values are programmed during power up of the TIQC system on a daily basis. In some embodiments, these values may hold for several days once programmed. In some embodiments, these values are predetermined. In some embodiments, these values are determined based on measurements performed at startup of the TIQC system. In some embodiments, these values may be real-time adjustable when the TIQC system is running. In some embodiments, the gains and DC offset voltages may be analog. In some embodiments, the gains and DC offset voltages may be digital. In some embodiments, one part of the gains and DC offset voltages may be analog, and another part of the gains and DC offset voltages may be digital. The above are merely illustrative and non-limiting embodiments. Various modifications and combinations of these embodiments, as well as other embodiments, will be apparent to persons skilled in the art upon reference to the above description.

Figure 5A:
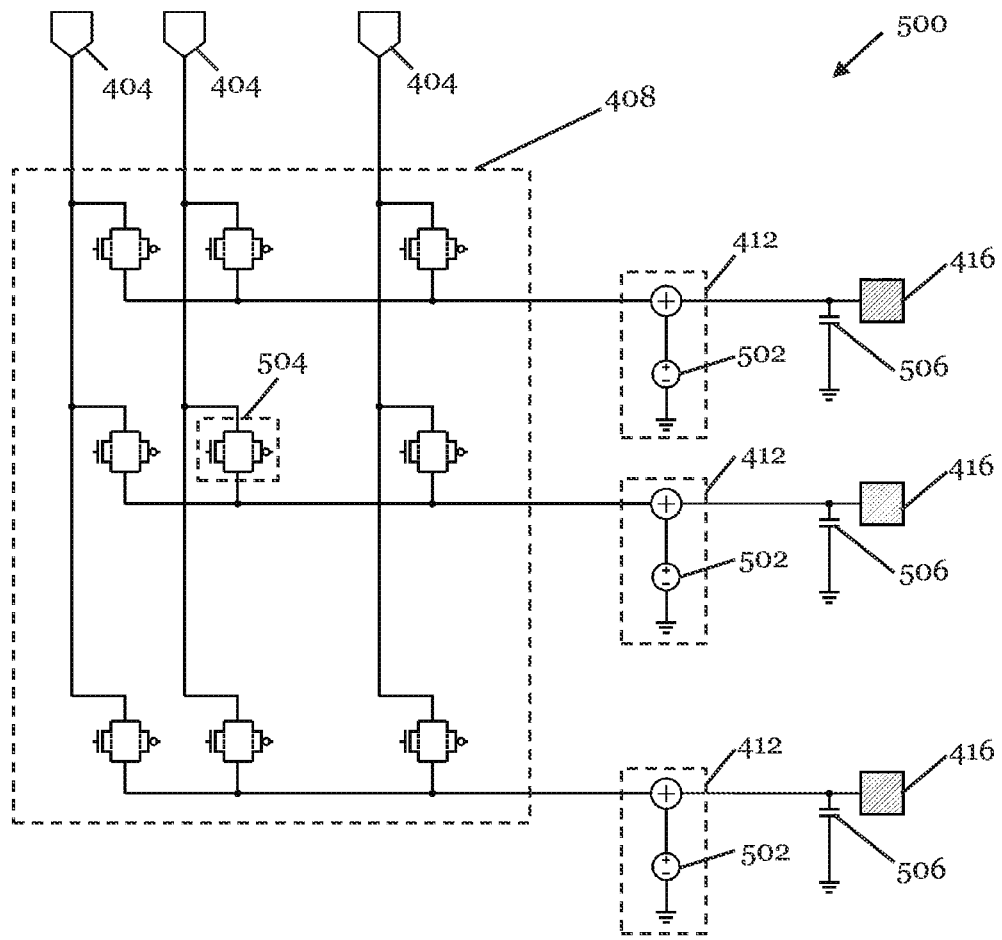
FIGS. 5A-5D illustrate stray electric field compensation circuits with various implementations of direct current (DC) offset circuits according to some embodiments.

FIGS. 5A-5D illustrate stray electric field compensation circuits with various implementations of DC offset circuits according to some embodiments. FIG. 5A illustrates a stray electric field compensation circuit 500 with DC offset circuits implemented using voltage summing circuits according to some embodiments. The stray electric field compensation circuit 500 includes a plurality of DACs 404, a multiplexer 408, a plurality of DC offset circuits 412, and a plurality of electrodes 416 that are coupled together in a way similar to those depicted in FIG. 4. Each DC offset circuit 412 is a voltage summing circuit that outputs a sum of an individual voltage source 502 and a voltage signal of a corresponding output of the multiplexer 408. The voltage source 502 is associated to a corresponding electrode 416 and may provide a DC offset voltage determined as described above.

The multiplexer 408 includes a plurality of switches 504 coupled between multiple inputs (that are coupled to the plurality of DACs 404) and multiple outputs (that are coupled to the plurality of DC offset circuits 412) of the multiplexer 408. When a switch 504 of the multiplexer 408 is turned on, the DAC 404 and the DC offset circuit 412 coupled by the switch 504 are connected. While not shown in FIG. 5A, the switches 504 may be controlled by an electrode control circuit (such as the electrode control 330 in FIG. 3A) through a control signal. In one embodiment, the switch 504 may be a complementary metal-oxide semiconductor (CMOS) switch as shown in FIG. 5A. While FIG. 5A and some other figures in the present disclosure illustrate that the switch 504 is implemented as a CMOS switch, this description is not intended to be construed in a limiting sense. In various embodiments, persons skilled in the art may implement the switch 504 using any suitable circuits or any suitable signal processing techniques known in the art.

The stray electric field compensation circuit 500 may further include a plurality of capacitors 506. Each capacitor 506 is associated with a respective electrode 416 and is coupled between the ground and a voltage input of the electrode 416. This way, the DC offset voltage circuit 412 coupled to the electrode 416 may add a DC offset voltage provided by the voltage source 502 to a voltage provided by a DAC 404, which is connected to the DC offset voltage circuit 412 by the multiplexer 408, and may charge the capacitor 506 using the added voltage. Then the capacitor 506 may hold the added voltage at the electrode 416 while the DAC 404 is connected to another DC offset circuit by the multiplexer 408 to provide a voltage to another electrode, permitting control of multiple set of ions in parallel. Alternatively, each electrode 416 may have a built-in capacitor that functions similarly to the capacitor 506 to hold a voltage.

Figure 5B:
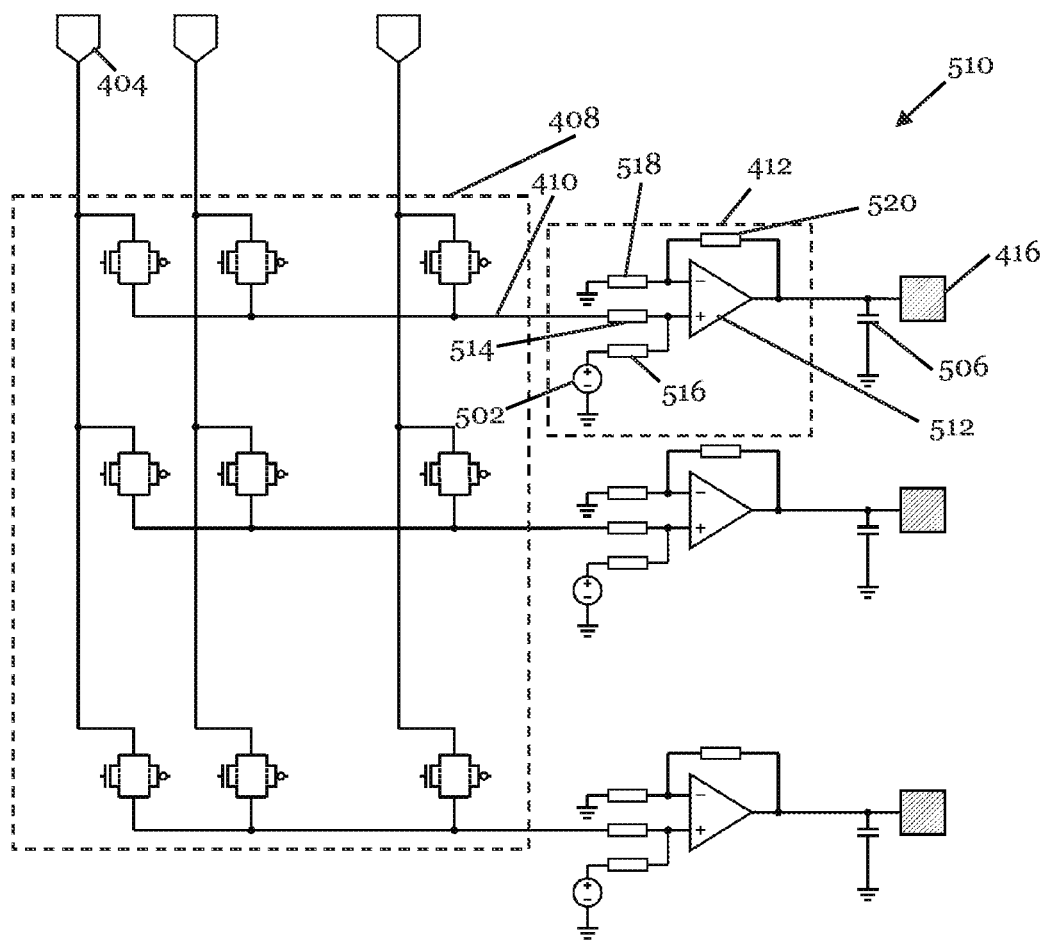

In some embodiments, a DC offset circuit may be implemented using an operational amplifier (OP-AMP) and a voltage source. As shown in FIG. 5B, each DC offset circuit 412 in a stray electric field compensation circuit 510 includes a respective OP-AMP 512. A corresponding voltage output 410 of the multiplexer 408 is coupled to a non-inverting input of the OP-AMP 512 through a resistor 514. The DC offset circuit 412 further includes a voltage source 502 that is coupled to the non-inverting input of the OP-AMP 512 through a resistor 516. Two resistors 518 and 520 form a voltage divider in the negative feedback of the OP-AMP 512. The voltage output 410 provides a voltage of V. The voltage source 502 provides a voltage of $V_{offset}$. The OP-AMP 512 outputs a voltage of $V_{out}$. The resistors 514, 516, 518, and 520 have resistances of R1, R2, R3, and R4, respectively. $V_{out}$ is determined by $$V_{out} = \left(1 + \frac{R4}{R3}\right)\frac{R2}{R1+R2}V + \left(1 + \frac{R4}{R3}\right)\frac{R1}{R1+R2}V_{offset}.$$

Thus, the OP-AMP 512 may be configured to amplify the voltage output 410 by a gain of $$\left(1 + \frac{R4}{R3}\right)\frac{R2}{R1+R2},$$

and then add a DC offset voltage of $$\left(1 + \frac{R4}{R3}\right)\frac{R1}{R1+R2}V_{offset}$$

to the amplified voltage. When the resistors 514, 516, 518, and 520 have equal resistances, the OP-AMP 512 will act as a voltage summing circuit in FIG. 5A and is configured to provide a summation of the voltage V and the DC offset voltage $V_{offset}$. In various embodiments, the DC offset voltage $V_{offset}$ may be generated by a DAC. The DAC that generates may be a relatively slow operating DAC since it may only provide a DC signal. As shown in the following examples, the digital value inputs of the DAC may be stored in latches and programmed during power up.

Figure 5C:
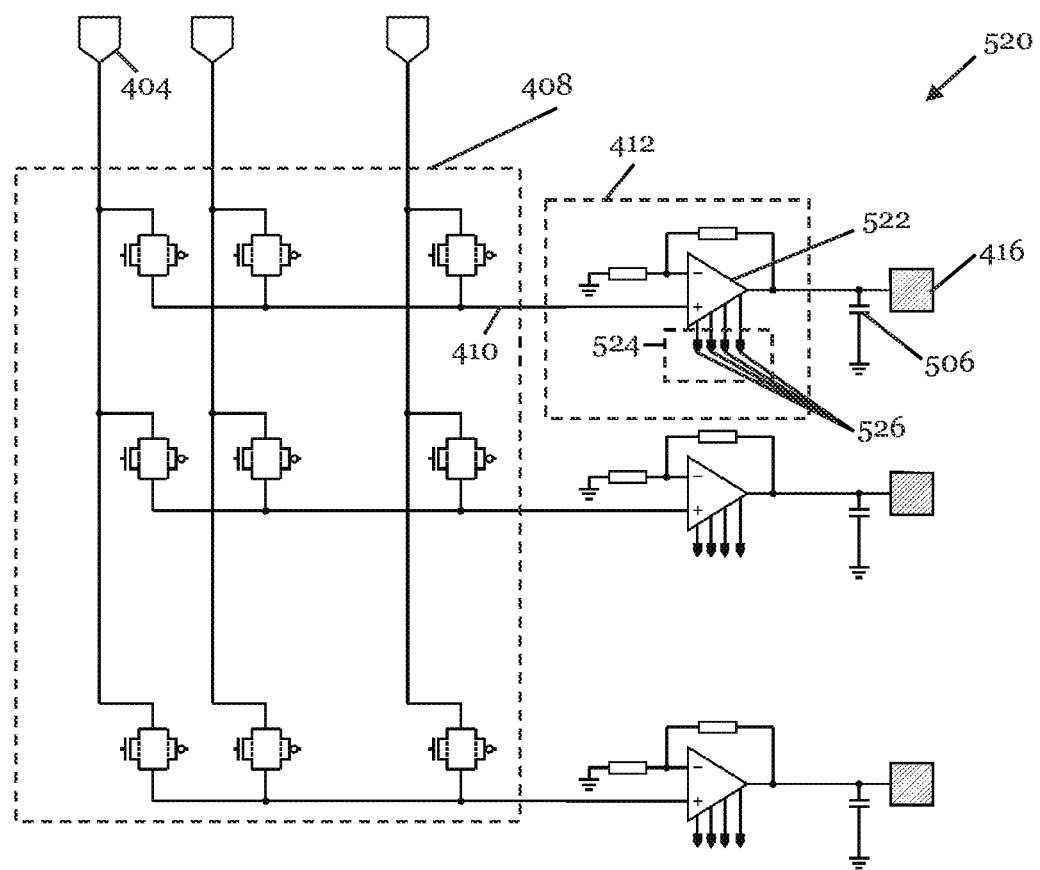

In some other embodiments, a DC offset circuit may be implemented using an OP-AMP controlled by a digital or analog input. FIG. 5C illustrates a stray electric field compensation circuit 520 with another implementation of DC offset circuits according to some embodiments. As shown in FIG. 5C, each DC offset circuit 412 includes a respective OP-AMP 522. A corresponding voltage output 410 of the multiplexer 408 is coupled to a non-inverting input of each OP-AMP 522. Each OP-AMP 522 may be controlled by an individual input 524. In a non-limiting example, the input 524 may be digital and may include a plurality of binary inputs 526. The digital input 524 may, in some embodiments, be stored in one or more data holding elements such as latches (not shown in FIG. 5C). In some embodiments, a latch may be a one bit storage element such as a set-reset (SR) latch, as a delay latch (D latch), or like, or may be another type of switch, latch, or the like. In other embodiments, a flip flop, state machine, storage circuit, logic element, or any other storage element may be used to hold, store, or latch the digital input 524. In another non-limiting example, the input 524 may be an analog input of the OP-AMP 522. In this case, an additional DAC may provide the compensation voltage or current to the analog input 524. Each OP-AMP 522 is configured to amplify the corresponding voltage 410 with an individual gain and add an individual DC offset voltage to the amplified voltage. The gain may be associated with the voltage divider of the OP-AMP 522, and the DC offset voltage may be associated with the digital input 524 and the OP-AMP 522.

Figure 5D:
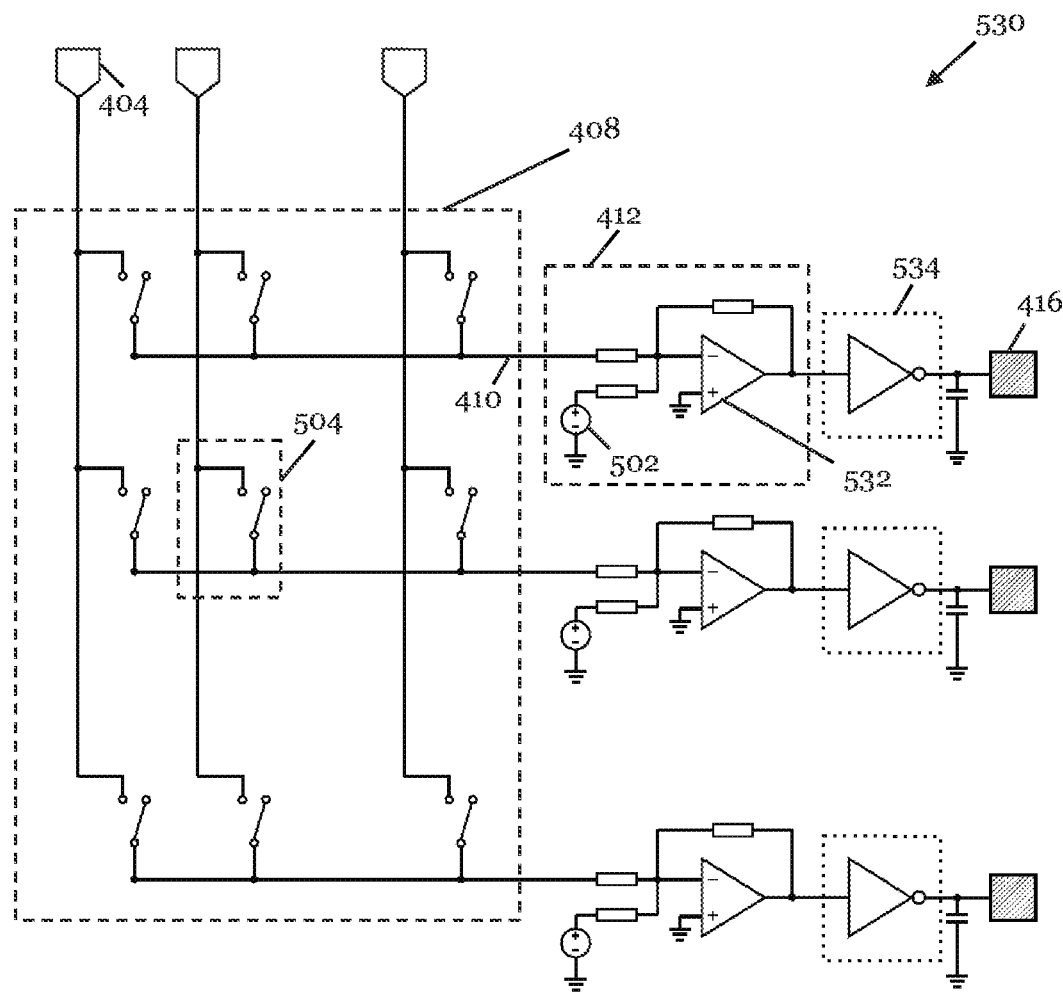

In some embodiments, a DC offset circuit may be implemented using an inverting summing amplifier circuit. As shown in FIG. 5D, each DC offset circuit 412 in a stray electric field compensation circuit 530 includes a respective OP-AMP 532. A corresponding voltage output 410 of the multiplexer 408 is coupled to an inverting input of the OP-AMP 532 through a resistor. The DC offset circuit 412 further includes a voltage source 502 that is coupled to the inverting input of the OP-AMP 532 through another resistor. The voltage output 410 provides a voltage of V. The voltage source 502 provides a voltage of $V_{offset}$. The OP-AMP 532 outputs a voltage of $V_{out}$. $V_{out}$ is determined by V, $V_{offset}$, and the resistors of the OP-AMP 532. In one embodiment, $V_{out}$ is further inverted by an inverter 534. The inverter 534 may be optional, and various implementations may be used. In another embodiment, DACs 404 may provide inverted signals. In yet another embodiment, the voltage output 410 may be inverted before it goes into the DC offset circuit 412. The OP-AMP 532 may also act as a voltage summing circuit in FIG. 5A and is configured to provide a summation of the voltage V and the DC offset voltage $V_{offset}$.

Figure 6:
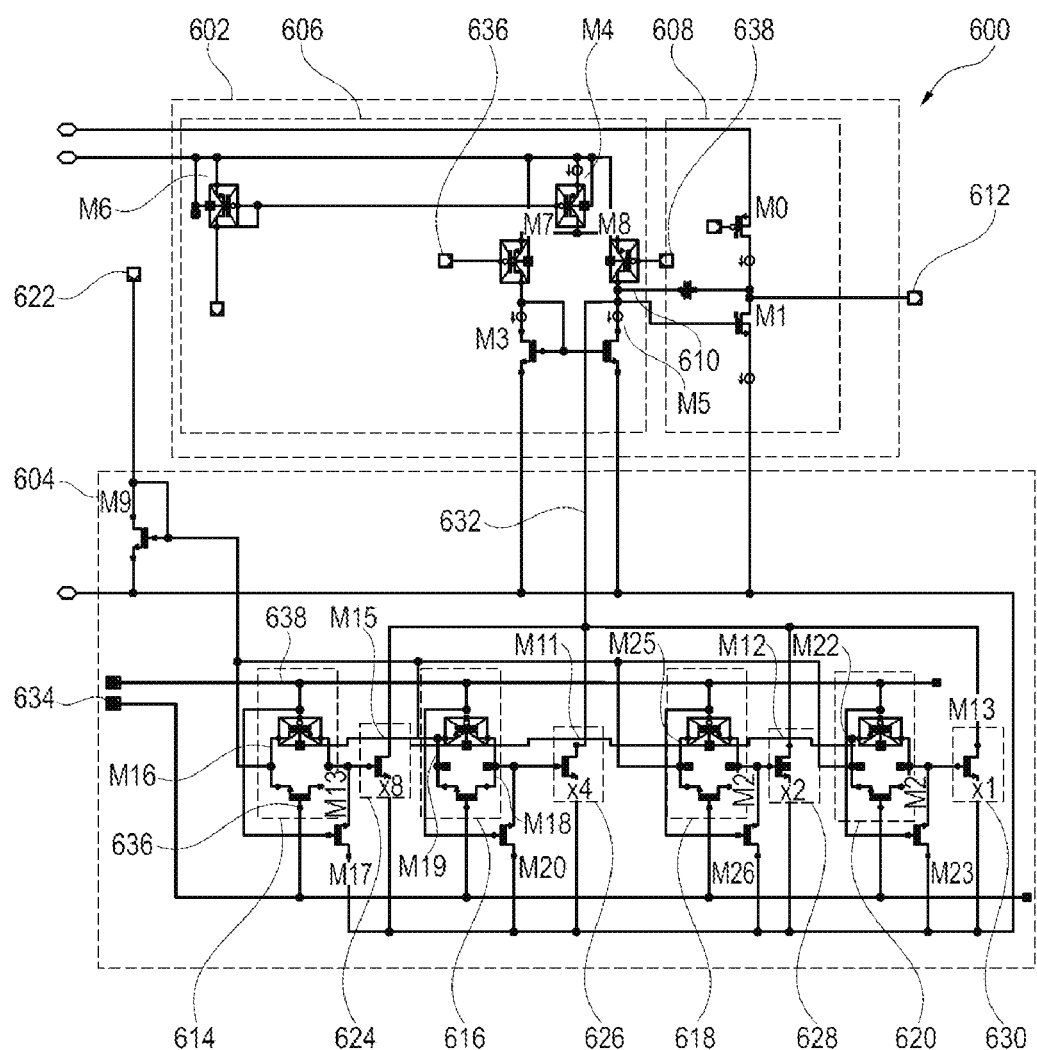
FIG. 6 is a digitally controlled DC offset circuit according to some embodiments.

FIG. 6 is a digitally controlled DC offset circuit 600 according to some embodiments. The digitally controlled DC offset circuit 600 includes an amplifier circuit 602 and an offset generation circuit 604. The amplifier circuit 602 may be a two stage CMOS OP-AMP including a differential amplifier 606 as the first stage and a common source amplifier 608 as the second stage. The offset generation circuit 604 is configured to generate an offset current coming from an output 610 of the differential amplifier 606 into the offset generation circuit 604 through a line 632.

Inputs of the offset generation circuit 604 include a constant bias current input 622 and a digital input 634. The offset generation circuit 604 includes multiple current sources 624, 626, 628, and 630 acting as current mirrors and mirroring the input bias current (622) multiplied by a factor of 8 (624), by a factor of 4 (626), by a factor of 2 (628) and a factor of one (630) controlled by the constant bias current input 622 and the digital input 634. The digital input 634 includes four binary bits. The current source 624 includes eight ($2^3$) metal-oxide-semiconductor field-effect transistors (MOSFETs) M10 connected in parallel, the current source 626 includes four ($2^2$) MOSFETs M11 connected in parallel, the current source 628 includes two ($2^1$) MOSFETs M12 connected in parallel, and the current source 630 includes one ($2^0$) MOSFET M13. Each bit in the digital input 634 controls on and off of one of the switches (614, 616, 618, and 620) that connects a corresponding current source to a MOSFET M9. When the switch is on, the MOSFETs in the corresponding current source share the same gate voltage with the MOSFET M9, and thus form a current mirror. For example, when the highest bit of the digital input 634 is set to 1 (i.e., the voltage difference between control inputs 636 and 638 of the switch 614 is at a high level), the switch 614 is turned on, which connects the gate of the MOSFET M9 to the gate of the eight MOSFETs M10. The MOSFETs M9-M13 may have the same properties. Let $V_C$ represent the voltage value at the constant offset voltage input 622 and $V_C$ is larger than a threshold voltage $V_T$ of M9. A drain-source current I of the MOSFET M9 is determined by $$I = \frac{1}{2}\mu_n C_{ox} \frac{W}{L}(V_C - V_T)^2(1 + \lambda V_{DS}),$$

where $\mu_n$, $C_{ox}$, W, L, $\lambda$, $V_T$, and $V_{DS}$ are parameters associated with M9. When the current source 624 is turned on, the current coming from the output 610 into the current source 624 is 8×I. The currents associated with the current sources 626, 628, and 630 are 4×I, 2×I, and I, respectively. Therefore, the current generated by the offset generation circuit 604 (going through the line 632) is K×I, where K is the decimal value of the digital input 634 and I is associated with the voltage $V_C$ at the constant offset voltage input 622 and properties of the MOSFET M9.

While the digital input 634 in FIG. 6 has a length of 4 bits, different lengths may be applied to a digitally controlled DC offset circuit in various embodiments. A digital input with more bits may lead to a wider range of the value K and a higher resolution of the current generated by the offset generation circuit 604.

Let $V_{in}$ denote an input voltage of the differential amplifier 606 (i.e., a voltage difference between input ports 636 and 638). $V_1$ denotes a voltage at the output 610 of the differential amplifier 606. $V_{out}$ denotes a voltage at the output 612 of the common source amplifier 608, which also is an output voltage of the amplifier circuit 602 and the digitally controlled DC offset circuit 600. When MOSFETs M7 and M8 have the same properties, and MOSFETs M3 and M5 have the same properties, $V_1$ is determined by $V_1 = g_1 R_1 V_{in} + K R_1 I$, where $g_1$ is the transconductance of the MOSFET M7, and $$R_1 = r_5 \| r_8 \| \frac{r_{10}}{K}$$

(i.e., the parallel combination of resistances $r_5$, $r_8$, and $r_{10}/K$, $r_5$, $r_8$, and $r_{10}$ being the on-resistances of the MOSFETs M5, M8, and M10, respectively). Consequently, $V_{out}$ is determined by $V_{out} = g_2 R_2 g_1 R_1 V_{in} + K g_2 R_2 R_1 I$, where $g_2$ is the transconductance of MOSFET M1, and $R2 = r_0 \| r_1$ (i.e., the parallel combination of resistances $r_0$ and $r_1$, $r_0$ being the on-resistance of MOSFET $M_0$ and $r_1$ being the on-resistance of MOSFET $M_1$).

Therefore, the digitally controlled DC offset circuit 600 is configured to amplify the input voltage $V_{in}$ by a gain, and then add a DC offset voltage to the amplified voltage. The gain is associated with properties of the amplifier circuit 602. The DC offset voltage is associated with the digital input 634, the constant offset voltage input 622, and the properties of the current sources in the offset generation circuit 604.

Figure 7:
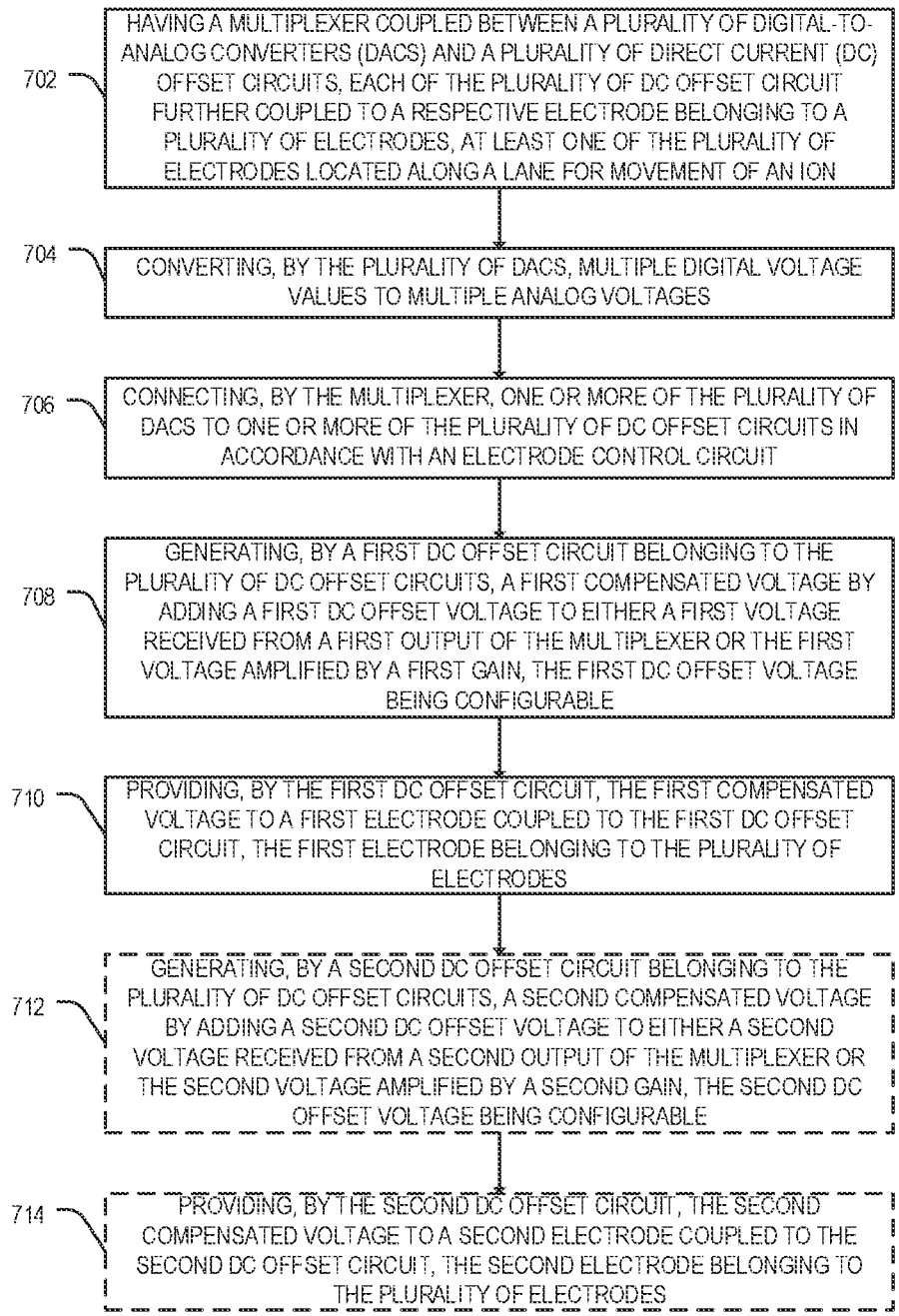
FIG. 7 illustrates a method for providing DC offset voltages in a TIQC system according to some embodiments.

FIG. 7 illustrates a method 700 for providing DC offset voltages in a TIQC system according to some embodiments. The method 700 begins at step 702, where a device has a multiplexer coupled between a plurality of DACs and a plurality of DC offset circuits. Each of the plurality of DC offset circuit is further coupled to a respective electrode belonging to a plurality of electrodes. At least one of the plurality of electrodes is located along a lane for movement of an ion. The method 700 proceeds to step 704, where the plurality of DACs convert multiple digital voltage values to multiple analog voltages. At step 706, the multiplexer connects one or more of the plurality of DACs to one or more of the plurality of DC offset circuits in accordance with an electrode control circuit. At step 708, a first DC offset circuit generates a first compensated voltage by adding a first DC offset voltage to either a first voltage received from a first output of the multiplexer or the first voltage amplified by a first gain. The first DC offset circuit belongs to the plurality of DC offset circuits. The first DC offset voltage is configurable.

Optionally, the method 700 may further include steps 712 and 714. At step 712, a second DC offset circuit generates a second compensated voltage by adding a second DC offset voltage to either a second voltage received from a second output of the multiplexer or the second voltage amplified by a second gain. The second DC offset circuit belongs to the plurality of DC offset circuits. The second DC offset voltage is configurable. At step 714, the second DC offset circuit provides the second compensated voltage to a second electrode coupled to the second DC offset circuit. The second electrode belongs to the plurality of electrodes.

An embodiment device includes a plurality of digital-to-analog converters (DACs), a multiplexer having multiple inputs and multiple outputs, the multiple inputs coupled to the plurality of DACs, the multiple outputs including a first output configured to provide a first voltage, a plurality of electrodes including a first electrode, at least one of the plurality of electrodes located along a lane for movement of an ion, and a plurality of direct current (DC) offset circuits including a first DC offset circuit, the first DC offset circuit coupled between the first output and the first electrode, the first DC offset circuit configured to add a first DC offset voltage to either the first voltage or the first voltage amplified by a first gain, the first DC offset voltage being configurable.

In some embodiments, the multiplexer is configured to selectively connect one or more of the plurality of DACs to one or more of the plurality of DC offset circuits in accordance with an electrode control circuit, and the first voltage is provided by a DAC connected by the multiplexer to the first DC offset circuit. In some embodiments, the first DC offset circuit includes an operational amplifier (OP-AMP), an input of the OP-AMP is coupled to the first output and an offset input, an output of the OP-AMP is coupled to the first electrode, the first gain is associated with the OP-AMP, and the first DC offset voltage is associated with the OP-AMP and the offset input. In some embodiments, the first DC offset circuit includes an OP-AMP and an offset generation circuit, the OP-AMP is further coupled between the first output and the first electrode, the offset generation circuit includes multiple current sources controlled by an input, the first gain is associated with the OP-AMP, and the first DC offset voltage is associated with the input, the multiple current sources, and the OP-AMP. In some embodiments, the OP-AMP is a two-stage complementary metal-oxide semiconductor (CMOS) OP-AMP, and wherein the input is a digital input. In some embodiments, the offset generation circuit is coupled to a current mirror of the two-stage CMOS OP-AMP and is configured to provide a bias current associated with the digital input and the multiple current sources. In some embodiments, the multiple current sources include at least one current source and a plurality of current mirrors. In some embodiments, the multiple current sources are associated with a constant offset voltage input. In some embodiments, the digital input includes a plurality of binary inputs, each of the plurality of binary inputs is provided by a respective latch, and the respective latch is programmed during power up via a digital interface. In some embodiments, the multiplexer includes a plurality of CMOS switches coupled between the multiple inputs and the multiple outputs, the plurality of CMOS switches controlled by an electrode control circuit. In some embodiments, the plurality of DC offset circuits further include a second DC offset circuit, the second DC offset circuit is coupled between a second output belonging to the multiple outputs of the multiplexer and a second electrode belonging to the plurality of electrodes, the second output is configured to provide a second voltage, the second DC offset circuit is configured to add a second DC offset voltage to either the second voltage or the second voltage amplified by a second gain, and the second DC offset voltage is configurable.

An embodiment ion control system includes an electrode control circuit, a plurality of electrodes, at least one of the plurality of electrodes located along a lane for movement of an ion, a plurality of digital-to-analog converters (DACs) configured to provide voltages to the plurality of electrodes, the voltages controlling the movement of the ion, a multiplexer including multiple inputs and multiple outputs, the multiple inputs coupled to the plurality of DACs, the multiplexer configured to selectively connect one or more of the plurality of DACs to one or more of the plurality of electrodes in accordance with a control signal provided by the electrode control circuit, and a plurality of direct current (DC) offset circuits, each of the plurality of DC offset circuit coupled between a corresponding output of the multiplexer and a corresponding electrode and configured to add a DC offset voltage to either an output voltage of the corresponding output of the multiplexer or the output voltage of the corresponding output of the multiplexer amplified by a gain, the DC offset voltage being configurable.

An embodiment method for providing direct current (DC) offset voltages in a trapped ion quantum computing (TIQC) system includes having a multiplexer coupled between a plurality of digital-to-analog converters (DACs) and a plurality of direct current (DC) offset circuits, each of the plurality of DC offset circuit further coupled to a respective electrode belonging to a plurality of electrodes, at least one of the plurality of electrodes located along a lane for movement of an ion, converting, by the plurality of DACs, multiple digital voltage values to multiple analog voltages, connecting, by the multiplexer, one or more of the plurality of DACs to one or more of the plurality of DC offset circuits in accordance with an electrode control circuit, generating, by a first DC offset circuit belonging to the plurality of DC offset circuits, a first compensated voltage by adding a first DC offset voltage to either a first voltage received from a first output of the multiplexer or the first voltage amplified by a first gain, the first DC offset voltage being configurable, and providing, by the first DC offset circuit, the first compensated voltage to a first electrode coupled to the first DC offset circuit, the first electrode belonging to the plurality of electrodes.

In some embodiments, the method further includes providing, by a DAC connected to the first DC offset voltage by the multiplexer, the first voltage to the first DC offset circuit. In some embodiments, the first DC offset circuit includes an operational amplifier (OP-AMP), an input of the OP-AMP is coupled to the first output and an offset input, an output of the OP-AMP is coupled to the first electrode, the first gain is associated with the OP-AMP, and the first DC offset voltage is associated with the OP-AMP and the offset input. In some embodiments, the first DC offset circuit includes an OP-AMP and an offset generation circuit, the OP-AMP is coupled between the first output and the first electrode, the offset generation circuit includes multiple current sources controlled by an input, the first gain is associated with the OP-AMP, and the first DC offset voltage is associated with the input, the multiple current sources, and the OP-AMP. In some embodiments, the OP-AMP is a two-stage complementary metal-oxide semiconductor (CMOS) OP-AMP, and the input is a digital input. In some embodiments, the method further includes providing, by the offset generation circuit, a bias current associated with the digital input and the multiple current sources to a current mirror of the two-stage CMOS OP-AMP. In some embodiments, the multiple current sources include at least one current source and a plurality of current mirrors. In some embodiments, the digital input includes a plurality of binary inputs, and the method further includes providing each of the plurality of binary inputs by a respective latch programmed during power up via a digital interface. In some embodiments, the multiplexer includes a plurality of CMOS switches controlled by the electrode control circuit. In some embodiments, the method further includes generating, by a second DC offset circuit belonging to the plurality of DC offset circuits, a second compensated voltage by adding a second DC offset voltage to either a second voltage received from a second output of the multiplexer or the second voltage amplified by a second gain, the second DC offset voltage being configurable, and providing, by the second DC offset circuit, the second compensated voltage to a second electrode coupled to the second DC offset circuit, the second electrode belonging to the plurality of electrodes.

Figure 8A:
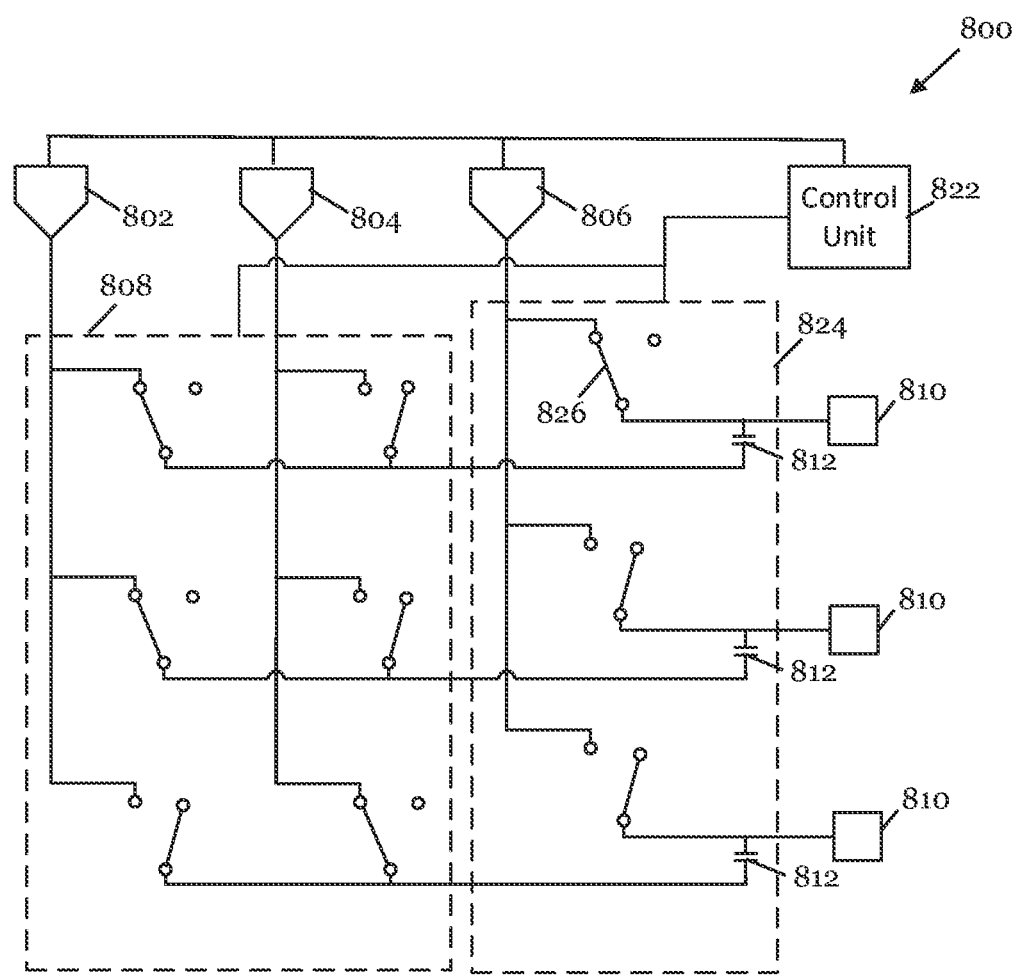
FIGS. 8A and 8B are logical diagrams illustrating a system with direct current (DC) offset circuits with a capacitor according to some embodiments.

FIG. 8A is a logical diagram illustrating a system 800 with direct current (DC) offset circuits 824 with capacitors 812 according to some embodiments. In some embodiments, the system 800 may have, for example, at least one constant voltage DAC 802, at least one voltage ramp DAC 804, and at least one DC offset DAC 806. Each electrode may have an associated DC offset circuit 824 having the capacitor 812 associated with the respective electrode 810, and a switch 826 that connects a DC offset DAC 806 to the capacitor 812.

A switch system such as a multiplexer 808 selectively connects the DACs 802, 804 to the electrodes 810 and associated offset capacitors 812 of the DC offset circuits 824. The multiplexer 808 may be controlled by, for example, a control unit 822 or other system, and may receive control signals from the control unit 822 that cause the multiplexer 808 to connect or disconnect the DACs 802, 804 to the capacitor 812. In some embodiments, a constant voltage DAC 802 or a voltage ramp DAC 804 is selectively connected by the multiplexer 808 to a second end of an offset capacitor 812 in response to a control signal from the control unit 822, and is connected through the offset capacitor 812, to a respective electrode 810.

The DC offset DAC 806 may be selectively connected by the DC offset circuits 824 to a first end of an offset capacitor 812 in a respective DC offset circuit 824 and to the associated electrode 810. In some embodiments, the DACs 802, 804 are connected to the second end of the capacitors 812

Thus, a voltage with an offset may be set at the offset capacitor 812 according to both the DC offset DAC 806 voltage and the constant voltage DAC 802 voltage or voltage ramp DAC 804 voltage. The DC offset DAC 806 provides a voltage to the opposite end or port of the offset capacitor 812 from the end or port of the offset capacitor 812 to which the voltage from the constant voltage DAC 802 or voltage ramp DAC 804 is applied. This creates a differential voltage at the offset capacitor 812, permitting the DC offset DAC 806 to adjust or apply a first voltage while a second voltage is being applied by the voltage ramp DAC 804 or constant voltage DAC 802. Thus, the constant voltage DAC 802 or voltage ramp DAC 804 may provide the same voltage to each electrode 810, while still permitting the voltage at each electrode to be customized to set the particular electrode 810 with adjustment by the DC offset DAC 806.

The system 800 illustrates different connection arrangements. For example, in a first connection arrangement, the constant voltage DAC 802 may be connected to the second end of the offset capacitor 812 while the DC offset DAC 806 is connected to the first end of the offset capacitor 812 and to the respective electrode 810. This results in a voltage at to be held the offset capacitor 812 where the voltage has an offset provided by the DC offset DAC 806 to adjust a voltage provided by the constant voltage DAC 802. Thus, the constant voltage DAC 802 may provide a constant voltage to different electrodes 810, and a customized offset voltage for each electrode 810 may be provided without requiring an adder or other element that combines the constant voltage and offset voltage before being sent to the offset capacitors 812. Additionally, while not shown, the DC offset DAC 806 may be connected to the offset capacitor 812 at the same time as the voltage ramp DAC 804 to provide a customized offset for a selected electrode 810 during a voltage ramp.

Additionally, due to leakage at the offset capacitors 812, a periodic voltage refresh may be necessary to ensure that the voltage held at the offset capacitors 812 for application to the electrodes 810 is maintained within a desired range. The DC offset DAC 806 may be used to provide a DC offset when a voltage is being set at the offset capacitor 812, and may also be used to refresh the voltage held at the offset capacitor 812 by connecting the DC offset DAC 806 to the offset capacitor 812 while constant voltage DAC 802 is connected to the offset capacitor and the voltage ramp DAC 804 is disconnected from the same offset capacitor 812

In a second exemplary connection arrangement, a constant voltage DAC 802 may be connected to the second end of an offset capacitor 812, with the DC offset DAC being disconnected from the offset capacitor 812 and offset voltage having already been set in the offset capacitor 812. Connecting the constant voltage DAC 802 to the offset capacitor 812 may adjust a voltage across the offset capacitor 812 to result in an adjusted or compensated voltage being applied to the respective electrode 810. Notably, this connection arrangement permits a compensated voltage to be provided to the electrode 810 by connecting the constant voltage DAC 802 to the capacitor after connecting the DC offset DAC 806 to the electrode or the offset capacitor 812.

Similarly, in a third connection arrangement, the voltage ramp DAC 804 may be connected to the second end of the offset capacitor 812 with the DC offset DAC 806 disconnected from the offset capacitor 812 and the respective electrode 810. This connection arrangement permits a voltage ramp to be applied to the respective electrode with an existing offset voltage already set on the offset capacitor 812, and with the DAC offset DAC 806 disconnected from the offset capacitor 812.

The offset DAC 806 may be selectively connected to one or more of the electrodes 810 by a switch 826 or other element of the DC offset circuits 824 between the offset DAC 806 and electrodes 810. This permits the individual DC offset to be taken into account for each electrode 810, and a voltage across the individual capacitors 812 may be set to hold a desired voltage at the respective electrode 810. Additionally, the offset DAC 806 may be used to adjust, correct, or otherwise refresh the voltage at multiple capacitors 812 so that a large number of electrodes 810 can be refreshed with one single refresh DAC 802.

The offset DAC 806 may be controlled to periodically refresh the voltage held for each electrode 810 by a respective offset capacitor 812. In some embodiments, the control unit 822 may have a refresh period or refresh rate set according to test data or physical parameters of the system 800, according to live operating conditions of the system 800, or according to another parameter. The refresh period may depend on the capacitance of the offset capacitors 812 and the leakage experienced by the offset capacitors 812. In some embodiments, the refresh rate may be set to keep the voltages within, for example, 95% of their desired value. The rate of refresh may, for example, be in the 10-100 kHz range for systems running at room temperature (70° F./21° C./293K). However, due to lower leakage at common TIQC operating temperatures near absolute zero (0K), the refresh rate may be in the 1-10 Hz range for such operating parameters. Additionally, the system 800 may store a desired voltage value associated with each electrode 810, and provide that value to the refresh DAC 806 for use in refreshing the respective electrode 810.

Figure 8B:
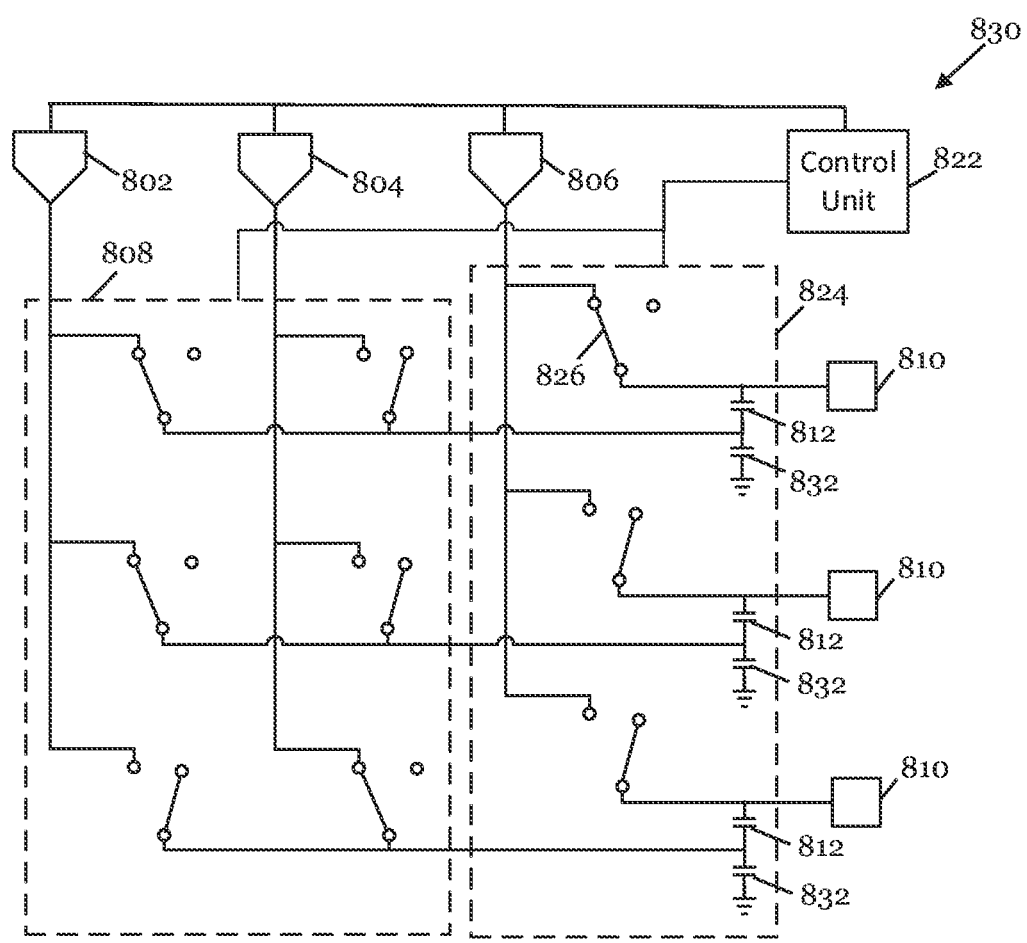

FIG. 8B with direct current (DC) offset circuits 824 with capacitors 812, 832 according to some embodiments. In some embodiments, each of the DC offset circuits 824 has a shunt capacitor 832 connected between the second end of the offset capacitor 812 and ground. The system 800 has DACs 802, 804 selectively connected by the multiplexer 808 to the second end of the offset capacitors 812 and to shunt capacitors 832. The shunt capacitors 832 may have a voltage set with respect to ground to maintain or set a desired voltage at the associated offset capacitors 812. In some embodiments, the shunt capacitors 832 shunt RF disturbance on the DC electrodes that might come from parasitic coupling between DC electrodes and RF electrodes (not shown here).

Figure 9:
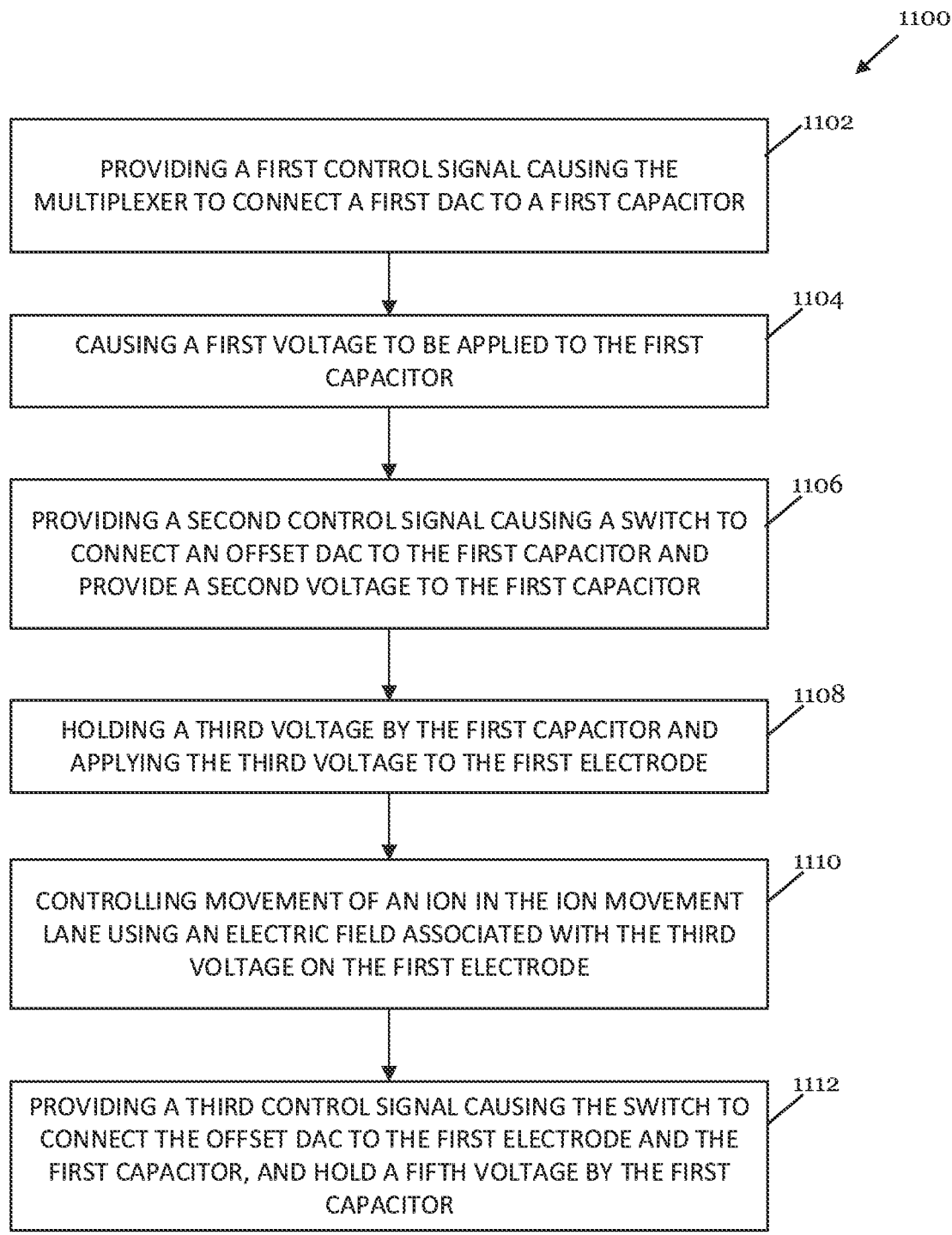
FIG. 9 is a flow diagram illustrating a method for using of a system with a DC refresh DAC according to some embodiments.

FIG. 9 is a flow diagram illustrating a method 1100 for using of a system with a DC refresh DAC according to some embodiments. In block 1102, a control unit provides a first control signal to the multiplexer. The control signal connects the first DAC of a plurality of DACs to a capacitor associated with an electrode. In block 1104, connecting the first DAC to the capacitor caused ta first voltage provided by the first DAC to be applied to the first capacitor. In block 1106, a second control signal is provided by the control unit to a switch, causing a switch to connect an offset DAC to the capacitor. In block 1108, connecting the offset DAC to the capacitor causes the offset DAC to apply a voltage to the electrode, and causes the capacitor to hold a third voltage associated with the voltage provided by the offset DAC. In block 1110, the system controls movement of an ion in the ion movement lane using an electric field associated with third voltage on the first electrode.

In block 1112, in some embodiments, the system may refresh a voltage held on the capacitor. The control unit providing a third control signal to the switch that causes the switch to connect the offset or refresh DAC to the first electrode and the first capacitors. Connecting the offset DAC to the capacitor further causes the capacitor to hold a fifth voltage associated with fourth voltage provided by the offset DAC. Additionally, after the system refreshes the voltage on the capacitor, the offset or refresh DAC may be disconnected from the electrode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
a plurality of digital-to-analog converters (DACs);
a multiplexer having multiple inputs and multiple outputs, the multiple inputs coupled to the plurality of DACs, the multiple outputs including a first output configured to provide a first voltage;
a plurality of electrodes including a first electrode, at least one of the plurality of electrodes located along a lane for movement of an ion; and
a plurality of direct current (DC) offset circuits including a first DC offset circuit, the first DC offset circuit coupled between the first output and the first electrode, the first DC offset circuit configured to adjust, by a first DC offset voltage, either the first voltage or the first voltage amplified by a first gain, the first DC offset voltage being configurable.

2. The device of claim 1, further comprising an offset DAC, wherein the first DC offset circuit has an offset capacitor that is coupled between the first output and the first electrode, wherein the first DC offset voltage is provided by the offset DAC.

3. The device of claim 2, wherein the first DC offset circuit further comprises a switch between the offset DAC and a first end of the offset capacitor, wherein the switch is further connected to the first electrode, and wherein the switch is configured to selectively connect the offset DAC to the offset capacitor; and
wherein the multiplexer is connected to a second end of the offset capacitor, and is configured to provide the first voltage to the second end of the offset capacitor.

4. The device of claim 1, wherein the first DC offset circuit includes an operational amplifier (OP-AMP), wherein an input of the OP-AMP is coupled to the first output and an offset input, wherein an output of the OP-AMP is coupled to the first electrode, wherein the first gain is associated with the OP-AMP, and wherein the first DC offset voltage is associated with the OP-AMP and the offset input.

5. The device of claim 1, wherein the first DC offset circuit includes an operational amplifier (OP-AMP) and an offset generation circuit, wherein the OP-AMP is further coupled between the first output and the first electrode, wherein the offset generation circuit includes multiple current sources controlled by an input, wherein the first gain is associated with the OP-AMP, and wherein the first DC offset voltage is associated with the input, the multiple current sources, and the OP-AMP;
wherein the OP-AMP is a two-stage complementary metal-oxide semiconductor (CMOS) OP-AMP, wherein the input is a digital input, and wherein the offset generation circuit is coupled to a current mirror of the two-stage CMOS OP-AMP and is configured to provide a bias current associated with the digital input and the multiple current sources.

6. The device of claim 5, wherein the multiple current sources include at least one current source and a plurality of current mirrors.

7. The device of claim 5, wherein the multiple current sources are associated with a constant offset voltage input.

8. The device of claim 5, wherein the digital input includes a plurality of binary inputs, wherein each of the plurality of binary inputs is provided by a respective latch, and wherein the respective latch is programmed during power up via a digital interface.

9. The device of claim 1, wherein the multiplexer includes a plurality of CMOS switches coupled between the multiple inputs and the multiple outputs, the plurality of CMOS switches controlled by an electrode control circuit.

10. The device of claim 1, wherein the plurality of DC offset circuits further include a second DC offset circuit, wherein the second DC offset circuit is coupled between a second output belonging to the multiple outputs of the multiplexer and a second electrode belonging to the plurality of electrodes, wherein the second output is configured to provide a second voltage, wherein the second DC offset circuit is configured to add a second DC offset voltage to either the second voltage or the second voltage amplified by a second gain, and wherein the second DC offset voltage is configurable.

11. An ion control system comprising:
an electrode control circuit;
a plurality of electrodes, at least one of the plurality of electrodes located along a lane for movement of an ion;
a plurality of digital-to-analog converters (DACs) configured to provide voltages to the plurality of electrodes, the voltages controlling the movement of the ion;
a multiplexer including multiple inputs and multiple outputs, the multiple inputs coupled to the plurality of DACs, the multiplexer configured to selectively connect one or more of the plurality of DACs to one or more of the plurality of electrodes in accordance with a control signal provided by the electrode control circuit; and
a plurality of direct current (DC) offset circuits, each of the plurality of DC offset circuit coupled between a corresponding output of the multiplexer and a corresponding electrode and configured to adjust, by a DC offset voltage, either an output voltage of the corresponding output of the multiplexer or the output voltage of the corresponding output of the multiplexer amplified by a gain, the DC offset voltage being configurable.

12. The ion control system of claim 11, further comprising:
a plurality of capacitors, wherein each electrode of the plurality of electrodes is connected to an associated capacitor of the plurality of capacitors;
an offset DAC; and
a plurality of switches including a first switch, each switch of the plurality of switches connected between the offset DAC and a respective electrode of the plurality of electrodes, wherein the multiplexer has circuitry that is configured to selectively connect each DAC of the plurality of DACs to each electrode of the plurality of electrodes through the respective capacitor of the respective electrode; and
a control unit connected to the multiplexer, and configured to provide first control signals to the multiplexer to selectively control connections between each DAC of the plurality of DACs and the respective capacitor of each electrode of the plurality of electrodes, wherein the control unit is further configured to provide second control signals that control the plurality of switches to selectively control connections between the DAC of the plurality of DACs and the respective capacitor of each electrode of the plurality of electrodes, wherein the control unit is further configured to cause the multiplexer to connect a first DAC of the plurality of DACs to a first capacitor of a first electrode of the plurality of electrodes, and wherein the control unit is further configured to cause the first switch to connect the offset DAC to the first capacitor and to the first electrode, wherein connecting the offset DAC to the first electrode and connecting the offset DAC to the first electrode causes the first capacitor to hold a voltage associated with either an output voltage of the corresponding output of the multiplexer or the output voltage of the corresponding output of the multiplexer amplified by the gain and that is further associated with the DC offset voltage provided by the offset DAC.

13. A method for providing direct current (DC) offset voltages in a trapped ion quantum computing (TIQC) system, the method comprising:
having a multiplexer coupled between a plurality of digital-to-analog converters (DACs) and a plurality of direct current (DC) offset circuits, each of the plurality of DC offset circuit further coupled to a respective electrode belonging to a plurality of electrodes, at least one of the plurality of electrodes located along a lane for movement of an ion;
converting, by the plurality of DACs, multiple digital voltage values to multiple analog voltages;
connecting, by the multiplexer, one or more DACs of the plurality of DACs to one or more DC offset circuits of the plurality of DC offset circuits according to at least one first control signal from an electrode control circuit;
generating, by a first DC offset circuit belonging to the plurality of DC offset circuits, a first compensated voltage by adjusting, by a first DC offset voltage, either a first voltage received from a first output of the multiplexer or the first voltage amplified by a first gain, the first DC offset voltage being configurable; and
providing, by the first DC offset circuit, the first compensated voltage to a first electrode coupled to the first DC offset circuit, the first electrode belonging to the plurality of electrodes.

14. The method of claim 13, wherein each DC offset circuit of the one or more DC offset circuits comprises a capacitor connected to a respective electrode of the plurality of electrodes and a switch connected to a first end of the capacitor;
wherein the connecting the one or more DACs to the one or more DC offset circuits of comprises connecting, by the multiplexer, one or more DACs of the plurality of DACs to a second end of a respective capacitor of the one or more DC offset circuits of the plurality of DC offset circuits according to the at least one first control signal;
wherein the method further comprises providing, by the electrode control circuit, a second control signal causing the switch of the first DC offset circuit to selectively connect an offset DAC to the first end of the respective capacitor of the first DC offset circuit and provide the first DC offset voltage to the respective electrode.

15. The method of claim 13, further comprising:
providing, by a DAC connected to the first DC offset circuit by the multiplexer, the first voltage to the first DC offset circuit.

16. The method of claim 13, wherein the first DC offset circuit includes an operational amplifier (OP-AMP), wherein an input of the OP-AMP is coupled to the first output and an offset input, wherein an output of the OP-AMP is coupled to the first electrode, wherein the first gain is associated with the OP-AMP, and wherein the first DC offset voltage is associated with the OP-AMP and the offset input.

17. The method of claim 13, wherein the first DC offset circuit includes an OP-AMP and an offset generation circuit, wherein the OP-AMP is coupled between the first output and the first electrode, wherein the offset generation circuit includes multiple current sources controlled by an input, wherein the first gain is associated with the OP-AMP, and wherein the first DC offset voltage is associated with the input, the multiple current sources, and the OP-AMP.

18. The method of claim 17, wherein the OP-AMP is a two-stage complementary metal-oxide semiconductor (CMOS) OP-AMP, and wherein the input is a digital input;
wherein the method further comprises providing, by the offset generation circuit, a bias current associated with the digital input and the multiple current sources to a current mirror of the two-stage CMOS OP-AMP; and
wherein the multiple current sources include at least one current source and a plurality of current mirrors.

19. The method of claim 18, wherein the digital input includes a plurality of binary inputs; and
wherein the method further comprises providing each of the plurality of binary inputs by a respective latch programmed during power up via a digital interface.

20. The method of claim 13, further comprising:
generating, by a second DC offset circuit belonging to the plurality of DC offset circuits, a second compensated voltage by adding a second DC offset voltage to either a second voltage received from a second output of the multiplexer or the second voltage amplified by a second gain, the second DC offset voltage being configurable; and
providing, by the second DC offset circuit, the second compensated voltage to a second electrode coupled to the second DC offset circuit, the second electrode belonging to the plurality of electrodes.

* * * * *